(12) United States Patent
Sato et al.

(10) Patent No.: US 7,095,764 B2
(45) Date of Patent: Aug. 22, 2006

(54) LASER DRIVING METHOD AND LASER DRIVING DEVICE

(75) Inventors: Katsunori Sato, Tokyo (JP); Toru Nagara, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/170,218

(22) Filed: Jun. 29, 2005

(65) Prior Publication Data

US 2006/0007971 A1 Jan. 12, 2006

(30) Foreign Application Priority Data

Jul. 8, 2004 (JP) ............................ P2004-201352

(51) Int. Cl.
*H01S 3/00* (2006.01)

(52) U.S. Cl. ................................. 372/38.02; 372/38.07

(58) Field of Classification Search ............. 372/38.02, 372/38.01, 38.07
See application file for complete search history.

(56) References Cited

U.S. PATENT DOCUMENTS

| 5,526,164 A | * | 6/1996 | Link et al. ................... 398/195 |
| 5,912,694 A | * | 6/1999 | Miyake et al. .............. 347/247 |
| 6,324,197 B1 | * | 11/2001 | Suda ........................ 372/38.01 |
| 6,795,458 B1 | * | 9/2004 | Murata ........................ 372/26 |
| 6,822,987 B1 | * | 11/2004 | Diaz et al. ................ 372/38.02 |

* cited by examiner

*Primary Examiner*—Minsun Harvey
*Assistant Examiner*—Tuan N. Nguyen
(74) *Attorney, Agent, or Firm*—Sonnenschein Nath & Rosenthal LLP

(57) ABSTRACT

Disclosed herein is a laser driving method including the step of adjusting an initial value of driving current for driving a laser when an operation mode is changed on a basis of a difference in magnitude between a first bias current including information on threshold current of the laser in a first operation mode and a second bias current including information on the threshold current in a second operation mode.

18 Claims, 14 Drawing Sheets

LASER DRIVING METHOD AND LASER DRIVING DEVICE

BACKGROUND OF THE INVENTION

The present invention relates to a laser driving method and a laser driving device, and particularly to a technique for controlling laser power in a recording and reproduction apparatus using a laser.

Recording and reproducing apparatus using a laser as a light source are utilized in various fields. For example, optical disk recording and reproducing apparatus (hereinafter also referred to simply as optical disk apparatus) using an optical disk as a medium for recording and reproduction, optical communication devices, laser printers and the like are drawing attention.

As to the laser used as a light source, semiconductor lasers using a semiconductor element have recently been widely used as a light source for various devices because semiconductor lasers are very small in size and respond quickly to driving current.

Phase change optical disks, magneto-optical disks and the like are widely known as rewritable optical disks used as media for recording and reproduction. Outputs of laser light applied in recording, reproduction, and erasure differ from each other. For example, at the time of recording, laser beam output is increased (for example 30 mW or more) to create recorded marks referred to as pits on an optical disk, whereas at the time of reproduction, the optical disk is irradiated with a weaker laser beam output (for example 3 mW) than at the time of recording to read information without destroying the recorded pits.

In order to obtain an error rate allowing recording and reproduction on a recent optical disk of high density and high transfer rate, it is necessary to properly control these laser beam intensities.

However, the semiconductor laser shows a significant temperature characteristic change in driving current-optical output characteristics of the semiconductor laser. In order to set the optical output of the semiconductor laser to desired intensity, a circuit for controlling the optical output of the semiconductor laser so as to make the optical output of the semiconductor laser constant, or a so-called APC (Auto Power Control) circuit is required.

APC circuits are roughly classified into a real-time system and a sample hold system. In the real-time system, the optical output of the semiconductor laser is monitored by a light receiving element, and an optical and electric negative feedback loop is formed to control a current for driving the semiconductor laser at all times so as to make a received light current (proportional to the optical output of the semiconductor laser) occurring in the light receiving element equal to a light emission command signal.

In the sample hold system, the optical output of the semiconductor laser is monitored by a light receiving element in a power setting period, and an optical and electric negative feedback loop is formed to control a driving current for driving the semiconductor laser so as to make a received light current (proportional to the optical output of the semiconductor laser) occurring in the light receiving element equal to a light emission command signal. A control value for the driving current is retained in other than the power setting period, and modulation is performed on the basis of the retained control value in other than the power setting period.

FIG. 13 is a block diagram showing an example of fundamental configuration of an APC circuit employing the real-time system. An APC circuit 800 is roughly divided into an optical system device 801 and an electric system device 802. A semiconductor laser (LD; Laser Diode) 812 in the optical system device 801 emits laser light L1. Laser light L1$a$ divided via a beam splitter 814 is applied to the surface of an optical disk via a collimator lens 818 and an objective lens 819, whereby recording, reproduction, and erasure are performed.

Also, laser light L1$b$ obtained by dividing the laser light L1 emitted from the semiconductor laser (LD; Laser Diode) 812 by the beam splitter 814 is applied to a photodiode 816 as a light receiving element. A current (IFPD) obtained by photoelectric conversion by the photodiode 816 is transmitted as a signal of a feedback system to the electric system device 802.

A current-to-voltage converting unit (I/V converter) 826 in the electric system device 802 converts the current output (feedback current IFPD) of the photodiode 816 into a voltage signal. In the meantime, a current-to-voltage converting unit (I/V converter) 836 similarly converts a power reference current IREF generated by a reference current generating unit 832 and set by a digital/analog (D/A) converting unit 834 into a voltage signal. Both the voltage signals are input to an error amplifier 840.

In the APC circuit 800 of such a configuration, an APC negative feedback loop as a whole is formed so that the differential inputs to the error amplifier 840 balance each other, and the output of the error amplifier 840 is set to an arbitrary voltage. A voltage-to-current converting unit (V/I converter) 880 converts the voltage into a current signal. A current driving unit (Driver) 892 amplifies the current signal, and then supplies a driving current ILD to the semiconductor laser 812 to drive the semiconductor laser 812.

Thus, in the APC circuit 800, the negative feedback control loop is formed so as to make the feedback current IFPD=the power reference current IREF, the laser driving current ILD is determined by a ratio of an amount $\Delta$IFPD of optical system feedback to $\Delta$ILD, and laser light emission power is determined by current-to-light conversion efficiency of the semiconductor laser 812.

It is generally known that a laser oscillates with a driving current higher than a light emission threshold current and that current-to-light conversion sensitivity of a laser shows a substantially constant characteristic.

For example, FIG. 14 is a diagram showing a relation between driving current and laser power. As shown in the figure, the driving current higher than a light emission threshold current Ith causes oscillation, and current-to-light conversion sensitivity $\Delta$PLD/$\Delta$ILD shows a substantially constant characteristic. A change in the temperature causes the threshold current to drift greatly with a positive temperature coefficient. The driving current Ild for obtaining desired laser power Pld is expressed by Equation (1). When there is a temperature drift of the light emission threshold current Ith and the current-to-light conversion sensitivity $\Delta$PLD/$\Delta$ILD of a laser, the driving current Ild is correspondingly changed.

[Equation 1]

$$Ild = \Delta ILD/\Delta PLD * Pld + Ith \quad (1)$$

Hence, as an APC system, a real-time APC system is desirable in which laser power control is performed at all times in each of a recording mode and a reproduction mode.

Mark edge recording, which uses changes at both ends of a mark for recording, has become mainstream because of superiority thereof for achieving higher density of a recent writable optical disk. As a technique for preventing data errors due to mark shape distortion in mark edge recording, a write strategy technique in which multi-pulse modulation of laser output power is performed according to disk material and recording speed is known (see for example Patent Document 1).

[Patent Document 1]

Japanese Patent Laid-Open No. 2000-244054

As a mechanism for performing the multi-pulse modulation of the laser output power when the write strategy technique is employed to drive the laser, there is for example a system (hereinafter referred to also as a superimposition driving system) in which a current pulse component for generating a light emission waveform of multilevel power is superimposed on a bias current component providing the threshold current Ith of the laser, a combined current is thereby generated, and the combined current is supplied to the laser to thereby perform pulse driving of the laser.

SUMMARY OF THE INVENTION

However, when such a superimposition driving system is employed and APC control is performed, there are a control loop for controlling laser power based on the bias current component and a control loop for controlling laser power based on the current pulse component, and there is an APC pull-in interval in which a difference from a desired power is large at the time of a mode transition from the reproduction mode to the recording mode or from the recording mode to the reproduction mode, thus presenting a large problem in achieving higher density and higher transfer rate.

In reproduction after recording for a long period of time or in recording after reproduction for a long period of time, in particular, a temperature drift of the light emission threshold value is increased due to a difference in heat generated by the laser itself and a change in an ambient temperature because of a large difference in laser output between the time of recording and the time of reproduction as described above, and thus the problem becomes larger.

The present invention has been made in view of the above situation, and it is desirable to propose a mechanism that makes it possible to alleviate a phenomenon in which a change in the threshold current of a laser due to a factor such as the ambient temperature or the like adversely affects the driving of the laser.

According to an embodiment of the present invention, there is provided a laser driving method including the step of adjusting an initial value of driving current for driving a laser when an operation mode is changed on a basis of a difference in magnitude between a first bias current including information on threshold current of the laser in a first operation mode and a second bias current including information on the threshold current in a second operation mode.

The laser driving method is preferably combined with so-called APC control in which output power of laser light emitted from the laser is detected, and control is performed so as to make the detected output power constant.

A laser driving device according to another embodiment of the present invention is suitable for carrying out the laser driving method according to the embodiment of the present invention. The laser driving device includes an initial current value adjusting unit for adjusting an initial value of driving current for driving a laser when an operation mode is changed on a basis of a difference in magnitude between a first bias current including information on threshold current of the laser in a first operation mode and a second bias current including information on the threshold current in a second operation mode.

According to the embodiments of the present invention, the initial value of the driving current for driving the laser is adjusted when the operation mode is changed on the basis of the difference between the bias currents including the information on the threshold current in the plurality of operation modes.

Thus, when the mode is changed and the bias currents have a difference therebetween, the initial current after the mode transition can be set on the basis of the difference. Consequently, the initial value can be set so as to eliminate the effect of a temperature drift of the threshold current of the laser, and therefore an appropriate initial value can be provided at the time of a mode transition. Thus, even under a condition where the threshold current of the laser is changed due to a factor such as the ambient temperature or the like, it is possible to alleviate a phenomenon in which the change in the threshold current of the laser adversely affects the driving of the laser.

DETAILED DESCRIPTION OF THE PREFERRED EMBODIMENTS

Preferred embodiments of the present invention will hereinafter be described in detail with reference to the drawings.

Figure 1:
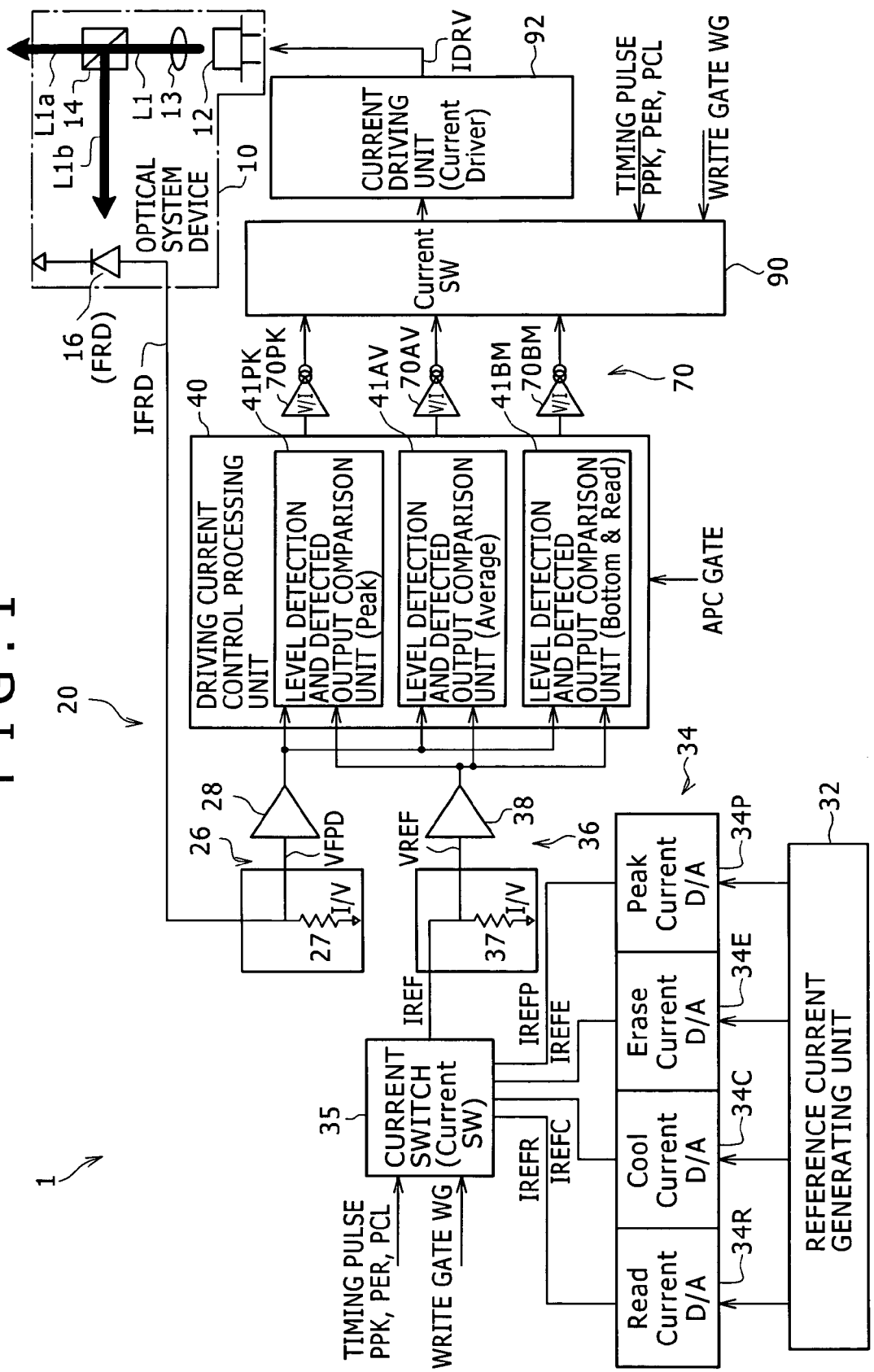
FIG. 1 is a block diagram showing a configuration of a laser light output controlling device as an example of a laser driving device according to the present invention.

FIG. 1 is a block diagram showing a configuration of an embodiment of a laser light output controlling device as an example of a laser driving device according to the present invention. This laser light output controlling device 1 uses a phase change disk as a medium, and employs an APC system for real-time control of each laser power of the strategy.

The laser light output controlling device 1 is characterized by having a functional element for correcting an error amplifier input in a control loop for providing a current pulse by using an input error of an error amplifier in another control loop for providing a bias current, in superimposing the current pulse for generating a light emission waveform of multilevel power on a current component providing a threshold current of a laser, thereby generating a combined current, and supplying the combined current to the laser to thereby perform pulse driving of the laser.

The configuration is characterized in particular by subtracting a voltage of a photodiode detection system as a feedback system from a voltage of a reference input system for providing a reference setting in a control loop, thereby extracting an input error of an error amplifier in the control loop for providing a bias current, and subtracting the extracted input error from a voltage of a reference input system for an error amplifier input in another control loop. Concrete description will be made in the following.

Figure 13:
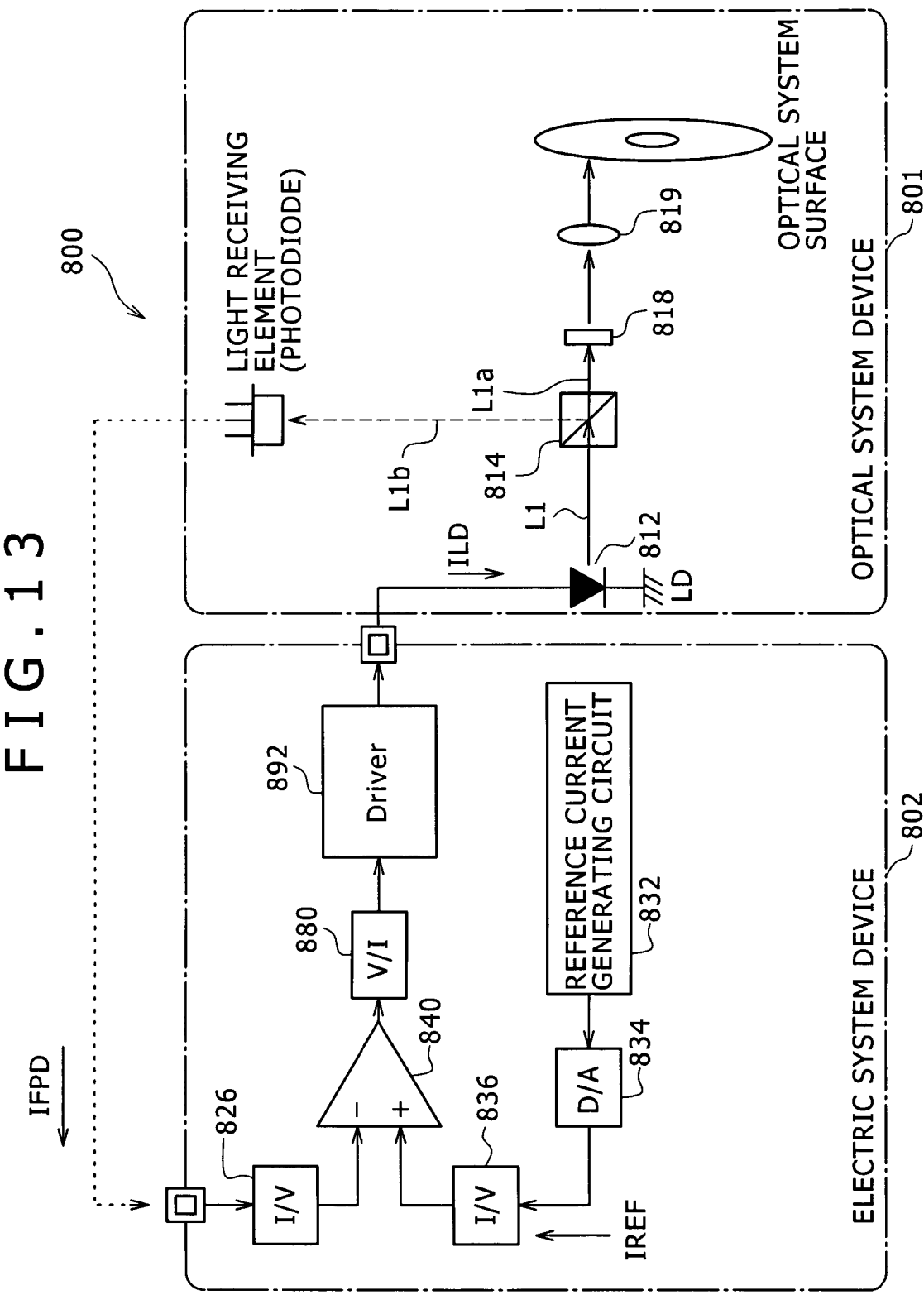
FIG. 13 is a block diagram showing a configuration of an APC circuit employing a real-time system.
Figure 14:
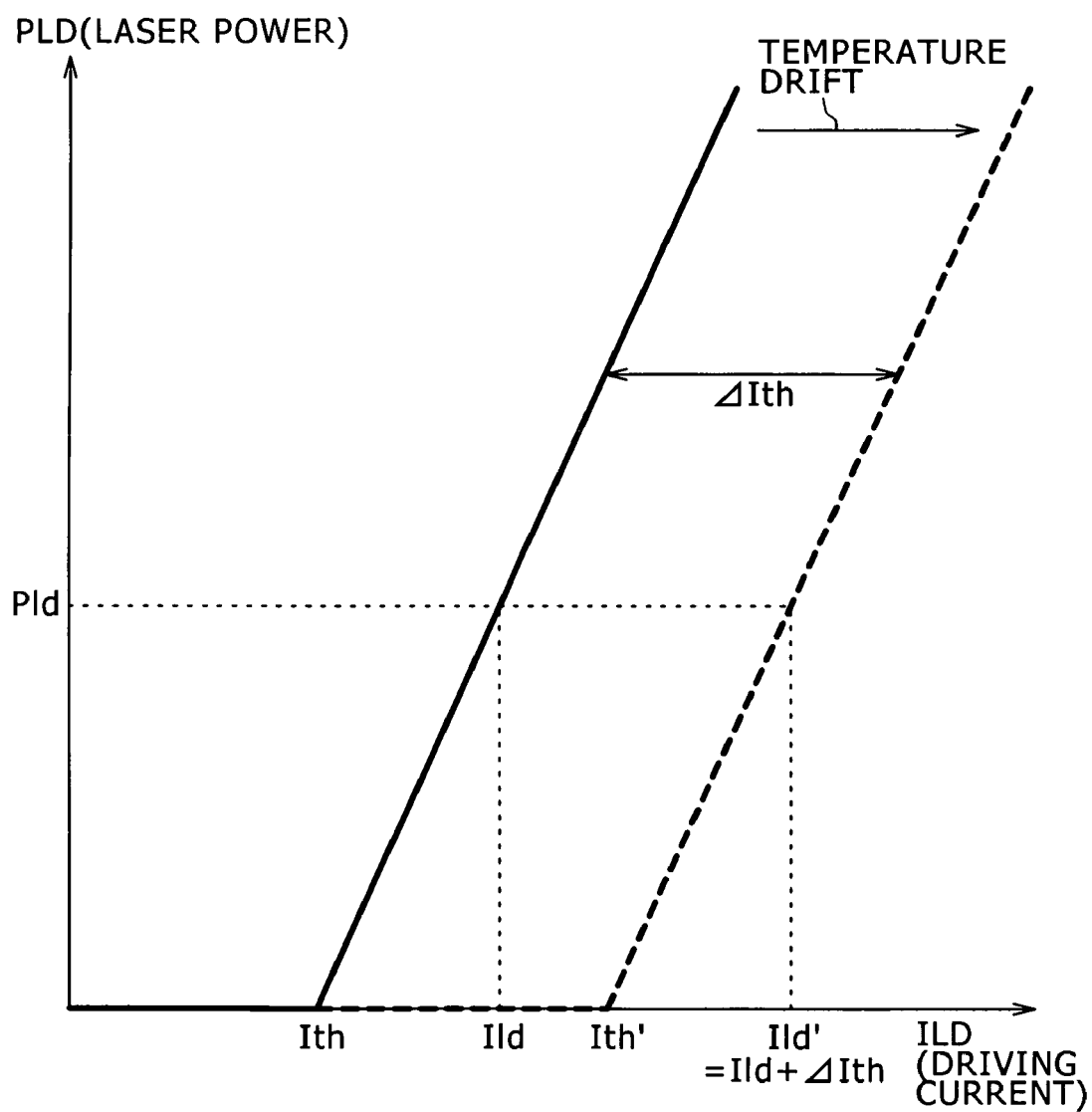
FIG. 14 is a diagram showing a relation between driving current and laser power.

As with the APC circuit shown in FIG. 13, the laser light output controlling device 1 has an optical system device 10 and an electric system device 20. The optical system device 10 irradiates an optical disk 9 as an example of a recording and reproducing medium with a component of arbitrary laser light L1 to thereby perform recording, reproduction, and erasure.

Specifically, the optical system device 10 includes: a semiconductor laser (for example a laser diode LD) 12 as an example of a laser light source driven by the electric system device 20; and an objective lens 13 for collimating the laser light L1, which is diffused light emitted from the semiconductor laser 12.

The optical system device 10 further includes: a beam splitter 14 as an example of an optical member for separating the laser light L1 emitted from the semiconductor laser 12 and passed through the objective lens 13 into transmitted light L1a and reflected light L1b reflected at an angle of 90 degrees, and reflecting reproduced light obtained by collimating reflected light from the optical disk 9 by an objective lens not shown in this figure in a direction of a photodetector for reproduction not shown in the figure; and a photodiode (FRD) 16 as an example of a laser power detecting unit (optical output detecting unit) for detecting the optical output of the semiconductor laser 12 by receiving and monitoring the reflected light L1b reflected by the beam splitter 14. The photodiode 16 has a cathode side connected to a reference power supply, and an anode side connected to the electric system device 20.

A part of the laser light L1 emitted from the semiconductor laser 12 is passed through the objective lens 13, the beam splitter 14, and an objective lens not shown in the figure provided on the side of the optical disk 9 not shown in the figure, and then condensed on a recording film of the optical disk 9 to thereby form a laser beam spot for reproduction and recording.

At the same time, a part of the laser light L1 emitted from the semiconductor laser 12 becomes the reflected light L1b via the beam splitter 14. The photodiode 16 is irradiated with the reflected light L1b. The photodiode 16 generates a detection current IFPD by converting the component of the received reflected light L1b of the laser light L1 into an electric signal (photoelectric conversion), and then transmits the detection current IFPD as a power detection signal to the electric system device 20 having a semiconductor laser control function. The photodiode 16 is an example of the laser power detecting unit for detecting the output power of the laser light L1 emitted from the semiconductor laser 12.

The electric system device 20 has a current-to-voltage converting unit (I/V) 26 for converting the detection current IFPD transmitted from the photodiode 16 into a detection voltage VFPD as a voltage signal (current-to-voltage conversion). The current-to-voltage converting unit 26 has a converting resistance 27 disposed between the anode side of the photodiode 16 and the reference power supply, and a buffer amplifier 28 for buffering the detection voltage VFPD obtained by converting the detection current IFPD into the voltage signal at the converting resistance 27.

The electric system device 20 further includes: a reference current generating unit 32 for generating pieces of reference current data for a peak, erase, cool, and read as laser power setting signals of four values corresponding to a peak power level, an erase power level, and a cool power level in a recording mode and a read power level in a reproduction (read) mode in a light emission pulse waveform of the semiconductor laser 12; and a DA converting unit 34 (34R, 34C, 34E, and 34P) for converting the pieces of reference current data generated by the reference current generating unit 32 into analog signals.

The reference current generating unit 32 and the DA converting units 34R, 34C, 34E, and 34P form an optical output setting unit for giving an optical output setting value for each level in the recording mode of the semiconductor laser 12.

The electric system device 20 further includes: a current switch (Current SW) 35 as an example of an optical output setting value switching unit for outputting a power reference current IREF corresponding to one or an arbitrary combination (superimposition) of the power reference currents (IREFR, IREFC, IREFE, and IREFP) converted into the analog signals by the DA converting unit 34; and a current-to-voltage converting unit 36 for converting the power reference current IREF output from the current switch 35 into a power reference voltage VREF as a voltage signal (current-to-voltage conversion).

The current-to-voltage converting unit 36 has a converting resistance 37 disposed between the output side of the current switch 35 and the reference power supply, and a buffer amplifier 38 for buffering the power reference voltage VREF obtained by converting the power reference current IREF into the voltage signal at the converting resistance 37.

In order to select and output the four setting values for the optical output of the semiconductor laser 12 which values are given by the optical output setting unit formed by the reference current generating unit 32 and the DA converting unit 34, the current switch 35 is supplied with switching control signals for controlling the switching operation of the current switch 35 from a central control unit not shown in the figure to switch between the semiconductor laser powers of the four values.

The switching control signals include for example a write gate signal WG (Write Gate) for switching between the recording (Write) mode and the reproduction (Read) mode, and timing pulses (PPK, PER, and PCL) for indicating timing corresponding to each of the peak power level, the erase power level, and the cool power level in the light emission pulse waveform of the semiconductor laser 12 in the recording mode.

Though not shown in the figure, the current switch 35 has individual current sources corresponding to the peak power level, the erase power level, the cool power level, and the read power level, respectively, and switching elements turned on and off under control of the write gate signal WG and the timing pulses PPK, PER, and PCL. Under control of the write gate signal WG and the timing pulses PPK, PER, and PCL, the current switch 35 outputs a reference current corresponding to the power reference current IREF as a laser power setting signal.

With such a configuration, the laser light output controlling device 1 generates a light emission waveform of multilevel power by subjecting the bias current providing the threshold current of the semiconductor laser 12 and a plurality of current pulses to addition and subtraction. A laser power control system (APC control system) in a succeeding stage controls the multilevel power such that the laser power of the semiconductor laser 12 forms the light emission waveform of the multilevel power.

The electric system device 20 further includes a driving current control processing unit 40 for generating proper driving currents on the basis of the detection voltage VFPD resulting from the current-to-voltage conversion of the current-to-voltage converting unit 26 and the power reference voltage VREF resulting from the current-to-voltage conversion of the current-to-voltage converting unit 36.

The driving current control processing unit 40 has a level detection and detected output comparison unit 41PK for detecting peak (upper side head value) voltages VFPPK and VREPK of the detection voltage VFPD and the power reference voltage VREF, respectively, the peak voltages VFPPK and VREPK corresponding to the peak level, comparing the corresponding detected voltages with each other, and generating an error voltage ΔVPK between the detected voltages as a control voltage.

Similarly, the driving current control processing unit 40 has a level detection and detected output comparison unit 41AV for detecting average (average value) voltages VFPAV and VREAV of the detection voltage VFPD and the power reference voltage VREF, respectively, the average voltages VFPAV and VREAV corresponding to the erase level, comparing the corresponding detected voltages with each other, and generating an error voltage ΔVAV between the detected voltages as a control voltage.

The driving current control processing unit 40 also has a level detection and detected output comparison unit 41BM for detecting bottom (lower side head value) voltages VFPBM and VREBM of the detection voltage VFPD and the power reference voltage VREF, respectively, the bottom voltages VFPBM and VREBM corresponding to the cool level, comparing the corresponding detected voltages with each other, and generating an error voltage ΔVBM between the detected voltages as a control voltage, and detecting read levels VFPRD and VRERD of the detection voltage VFPD and the power reference voltage VREF, respectively, and generating an error voltage ΔVRD between the read levels as a control voltage.

In the feedback system using the photodiode 16, level detecting function parts in the level detection and detected output comparison units 41PK, 41AV, and 41BM for detecting the voltages FPPK, FPAV, and FPBM for the peak level, the average level, and the bottom level form an optical output detecting unit for detecting the optical output detected by the photodiode 16 as an example of the laser power detecting unit.

Incidentally, the circuit configurations of the level detection and detected output comparison units 41PK, 41AV, and 41BM are substantially the same. The word "substantially" is used because as a configuration specific to the present embodiment, the level detection and detected output comparison unit 41BM is to detect the bottom (lower side head value) voltages VFPBM and VREBM corresponding to the cool level and the read levels VFPRD and VRERD of the detection voltage VFPD and the power reference voltage VREF, respectively, while switching detection timing and correct an initial value at a time of mode switching, and the level detection and detected output comparison unit 41BM is provided with a circuit for this switching operation.

This is to set an initial value that eliminates an effect of a temperature drift of the threshold current Ith of the laser in order to reduce an APC pull-in time at a time of mode transition from reproduction to recording or from recording to reproduction. This point will be described later in detail.

In a reference system using the reference current generating unit 32, level detecting function parts in the level detection and detected output comparison units 41PK, 41AV, and 41BM for detecting the voltages REPK, REAV, and REBM for the peak level, the average level, and the bottom level form a reference output detecting unit for detecting a setting voltage provided by selecting and outputting optical output setting values in the recording mode of the semiconductor laser 12 at the current switch 35 which values are given by the optical output setting unit formed by the reference current generating unit 32 and the DA converting unit 34.

The photodiode 16 and the current-to-voltage converting unit 26 form the feedback system for returning the optical output of the semiconductor laser 12 to the level detection and detected output comparison units 41PK, 41AV, and 41BM. Error amplifying function parts for generating the error voltage ΔVBM, ΔVAV, ΔVPK, or ΔVRD as control voltage in the level detection and detected output comparison units 41 respectively function as an error amplifier in an APC control loop for a cool current Ic providing a bias current in a writing current, an error amplifier in an APC control loop for an erase current Ie providing one current pulse with the cool current Ic as a bias current component, an error amplifier in an APC control loop for a peak current Ip providing another current pulse with the cool current Ic as the bias current component, and an error amplifier in an APC control loop for a read current Ir.

The control loop for the bias current (corresponding to the cool current Ic in this example) is formed by the level detecting function parts and the error amplifying function part (error amplifier function part) of the level detection and detected output comparison unit 41BM and the like in the feedback system. This error amplifying function part functions as a first error amplifying part supplied with a feedback component corresponding to the bias current (the cool current Ic in this example) in the output power detected by the photodiode 16 as an example of the laser power detecting unit and a reference component providing a reference for the bias current. This error amplifying function part forms a main part of the bias control loop for controlling the bias current (the cool current Ic in this example) such that an error between both inputs becomes zero.

The control loop for the peak current Ip as one current pulse is formed by the level detecting function parts and the error amplifying function part (error amplifier function part)

of the level detection and detected output comparison unit 41PK and the like in the feedback system. The error amplifying function part functions as a second error amplifying part supplied with a feedback component corresponding to the peak current Ip in the output power detected by the photodiode 16 as an example of the laser power detecting unit and a reference component providing a reference for the peak current Ip. This error amplifying function part forms a main part of the peak current control loop (one example of a current pulse control loop) for controlling the peak current Ip as one current pulse such that an error between both inputs becomes zero.

The control loop for the erase current Ie as the other current pulse is formed by the level detecting function parts and the error amplifying function part (error amplifier function part) of the level detection and detected output comparison unit 41AV and the like in the feedback system. The error amplifying function part functions as a third error amplifying part supplied with a feedback component corresponding to the erase current Ie in the output power detected by the photodiode 16 as an example of the laser power detecting unit and a reference component providing a reference for the erase current Ie. This error amplifying function part forms a main part of the erase current control loop (one example of a current pulse control loop) for controlling the erase current Ie as the other current pulse such that an error between both inputs becomes zero.

In the present embodiment, the level detecting function parts in the respective level detection and detected output comparison units 41PK, 41AV, and 41BM each have a holding function, and are supplied with an APC gate pulse for controlling timing of level detecting operation. Under control of the APC gate pulse, the level detecting function parts perform a peak detection and a bottom detection in timing of a mark part, and perform an average value detection in timing of a space part.

In the present embodiment, each power setting pull-in is performed simultaneously by repetition data of marks and spaces of an equal width in an ALPC (Auto Laser Power Control) part in a disk format. A mark signal to be recorded is input for a sample gate signal of a peak value detector and a bottom value detector, and a space signal is input for a sample gate signal of an average value detector.

Using the holding function, at a time of recording, a peak detection and a bottom detection are performed in timing of a mark part (for example a high level) according to the APC gate as the sample gate signal for indicating the timing of the mark part, and each output value is held in timing of a low level to control peak power Pp and cool power Pc. An average value detection is performed in timing of a space part (for example a high level) according to the APC gate as the sample gate signal for indicating the timing of the space part, and the output value is held in timing of a low level to control erase power Pe.

Similar comparison and control is performed in a data part formed by random data. As for variation in the peak value detector due to mark length, since the peak voltages VFPPK and VREPK in the error amplifying function part are in synchronism with each other, the error voltage $\Delta$VPK as control voltage, which is the output of the error amplifying function part, is not varied. The same is true for variation in output of the bottom value detector due to mark length. Incidentally, the average value detection is not affected by mark length.

Incidentally, while the peak value detector, the bottom value detector, and the average value detector each use the holding function in three-value control at the time of recording in the present embodiment, the holding function using the sample gate signal may be applied to only the average value detector, and the holding function does not necessarily need to be applied to the peak value detector or the bottom value detector.

The electric system device 20 further includes a voltage-to-current converting unit (V/I) 70 (70PK, 70AV, and 70BM) in a stage following the driving current control processing unit 40, for converting the error voltages $\Delta$VPK, $\Delta$VAV, and $\Delta$VBM or $\Delta$VRD as outputs of the level detection and detected output comparison units 41PK, 41AV, and 41BM of the driving current control processing unit 40, the error voltages $\Delta$VPK, $\Delta$VAV, and $\Delta$VBM or $\Delta$VRD corresponding to the peak power level, the erase power level, the cool power level, and the read power level, respectively, into control currents IPK, IER, and ICL or IRD, respectively (voltage-to-current conversion).

The electric system device 20 further includes: a current switch (Current SW) 90 as an example of a comparison result switching unit for selecting the control current IPK, IER, ICL, or IRD converted by the voltage-to-current converting unit 70, the control current IPK, IER, ICL, or IRD corresponding to the error voltage $\Delta$VPK, $\Delta$VAV, $\Delta$VBM or $\Delta$VRD output as comparison result from the level detection and detected output comparison units 41PK, 41AV, and 41BM, in synchronism with the switching operation of the current switch 35 as an example of the optical output setting value switching unit; and a current driving unit (Current Driver) 92 for driving the semiconductor laser 12 by amplifying a selected output current ISEL selected by the current switch 90 which current corresponds to the comparison result (the error voltage $\Delta$VPK, $\Delta$VAV, $\Delta$VBM or $\Delta$VRD) and supplying the result as a driving current IDRV to the semiconductor laser 12.

With such a configuration, the driving current control processing unit 40 in the electric system device 20 converts the detection current IFPD of the photodiode 16 into the detection voltage VFPD by the current-to-voltage converting unit 26, and similarly converts the power reference current IREF generated by the reference current generating unit 32 and set by the DA converting unit 34 into the power reference voltage VREF by the current-to-voltage converting unit 36. The detection voltage VFPD and the power reference voltage VREF are input to the error amplifying function parts in the level detection and detected output comparison units 41PK, 41AV, and 41BM.

The driving current control processing unit 40 as a whole forms a negative feedback loop for automatic power control (APC) so that the differential inputs to the error amplifying function parts in the level detection and detected output comparison units 41PK, 41AV, and 41BM balance each other, that is, so that input errors are zero. The error voltage $\Delta$VPK, $\Delta$VAV, $\Delta$VBM or $\Delta$VRD as output of the level detection and detected output comparison units 41PK, 41AV, and 41BM, respectively, is set to an arbitrary voltage value as control voltage.

For example, in a format of a magneto-optical disk, an address part where a sector address is recorded, and an ALPC (Auto Laser Power Control) area for setting optical power levels for reproduction, erasure, and recording, respectively, are provided in front of a recording area (data part) of each sector. Address information is read from the address part in the reproduction mode, and each optical power level is set in the ALPC area. In other sections, the semiconductor laser 12 is made to emit light by the driving current IDRV corresponding to the selected output current ISEL output by the voltage-to-current converting unit 70 on the basis of a control value (each detected voltage) selected by the current switch 35 and held by the level detecting function parts having the holding function in the level detection and detected output comparison units 41PK, 41AV, and 41BM.

Letting K1 be a gain of the current driving unit 92 having a current amplifying function, K2 be efficiency of the optical system of the photodiode 16 for the semiconductor laser 12, and K3 be a transformer impedance of the current-to-voltage converting unit 26, a conversion characteristic of the laser light output controlling device 1 is K1*K2*K3*ILD.

The detection voltage VFPD converted by the current-to-voltage converting unit 26 is input to each of the level detecting function part performing peak detection in the level detection and detected output comparison unit 41PK, the level detecting function part performing average detection in the level detection and detected output comparison unit 41AV, and the level detecting function part performing bottom detection in the level detection and detected output comparison unit 41BM. Similarly, the power reference voltage VREF output from the current switch 35 and converted by the current-to-voltage converting unit 36 is input to each of the level detecting function part performing peak detection in the level detection and detected output comparison unit 41PK, the level detecting function part performing average detection in the level detection and detected output comparison unit 41AV, and the level detecting function part performing bottom detection in the level detection and detected output comparison unit 41BM.

Thus, when the detection voltage VFPD converted by the current-to-voltage converting unit 26 and the power reference voltage VREF converted by the current-to-voltage converting unit 36 are the same, voltage values of the level detecting function parts performing peak detection are the same, voltage values of the level detecting function parts performing average detection are the same, and voltage values of the level detecting function parts performing bottom detection are the same.

These output voltages are input to the error amplifying function parts in the level detection and detected output comparison units 41PK, 41AV, and 41BM, respectively. The error amplifying function parts output the error voltage ΔVPK as peak value control voltage, the error voltage ΔVAV as average value (average) control voltage, and the error voltage ΔVBM as bottom value control voltage. Since the peak value corresponds to the peak power Pp of laser power, the error voltage ΔVPK functions as control voltage for controlling the peak power Pp. Since the average corresponds to the erase power Pe of laser power, the error voltage ΔVAV functions as control voltage for controlling the erase power Pe. Since the bottom value corresponds to the cool power Pc of laser power, the error voltage ΔVBM functions as control voltage for controlling the cool power Pc.

Incidentally, in this feedback loop, rather than each power to be set being set sequentially in time series, control is performed simultaneously in the setting section so that the value of the power reference voltage VREFP corresponding to the power reference current IREFP for the peak level (corresponding to the peak power) and the value of K1*K2*K3*ILDP equal each other, the value of the power reference voltage VREFE corresponding to the power reference current IREFE for the average level (corresponding to the erase power) and the value of K1*K2*K3*ILDE equal each other, and the value of the power reference voltage VREFC corresponding to the power reference current IREFC for the bottom level (corresponding to the cool power) and the value of K1*K2*K3*ILDC equal each other.

Since the current-to-voltage converting units 26 and 36 are inserted, the peak level, the average level, and the bottom level of the detection current IFPD as a power detection signal from the photodiode 16 are consequently controlled to be equal to the power reference currents IREFP, IREFE, and IREFC as currents set by the reference current generating unit 32. Also in a data part in the disk format, the laser powers can be compared with the respective setting values and controlled in the closed loop.

The power reference current IREF providing a light emission waveform of multilevel power has the same waveform as the light emission strategy waveform of the semiconductor laser 12, so that the power reference current IREF can be compared with the detection current IFPD from the photodiode 16 to control the detection current IFPD. That is, APC system real-time control for real-time control of each laser power of the strategy of the phase change disk can be performed. Incidentally, at a time of reproduction, a light emission waveform is a DC waveform, and therefore the same APC control as in FIG. 13 is performed.

For example, as in FIG. 4 to be described later, in generating the laser light emission waveform by the current switch and applying the write strategy technique, when a desired waveform of the laser driving current is generated by superimposing the erase current Ie and the peak current Ip on the cool current Ic (as bias component), control is performed so that for example the peak level of the detection current IFPD as the power detection signal from the photodiode 16 is equal to a combined value of the power reference currents IREFP and IREFC set by the reference current generating unit 32 and the average level of the detection current IFPD is equal to a combined value of the power reference currents IREFE and IREFC set by the reference current generating unit 32.

Thus, the laser light output controlling device 1 according to the present embodiment can perform pulse driving in the power setting section in the same manner as in recording. Therefore an effect of DC light emission in the power setting section on laser life is eliminated. Further, since the pulse driving of the semiconductor laser 12 is performed in both the power setting section and a recording section, a difference in set laser power due to relaxation oscillations and characteristic variations of the semiconductor laser 12 does not occur. Further, since comparison and control are performed also in the data part, even when a droop characteristic of the semiconductor laser 12 occurs, it is possible to respond to the droop characteristic.

For example, as for the peak power Pp, the APC gate (sample gate signal) input to the driving current control processing unit 40 is set to a high level, the error amplifying function part compares the output voltage VFPPK of the current-to-voltage converting unit 26 in the detection system with the output voltage VREPK, that is, the optical power setting voltage of the current-to-voltage converting unit 36 in the power reference system, and the semiconductor laser 12 is driven on the basis of the error voltage ΔVPK as control voltage output by the error amplifying function part, whereby the peak power Pp is set.

By setting a loop band to a few MHz, pull-in for the setting of the peak power Pp is performed sufficiently in 1 μsec. The control voltage for the peak power Pp is held by the holding function of the level detection part 42 when the sample gate signal input as the APC gate to the driving current control processing unit 40 is set to a low level.

The other optical powers are similarly set in order. Thereafter, in the data part of the sector, the outputs of the voltage-to-current converting unit 70 which outputs are generated on the basis of these retained control voltages are selected by the current switch 90, thus enabling a recording light emission waveform and DC light emission for reproduction and erasure by the semiconductor laser 12.

Thus, by realizing the pulse driving of the semiconductor laser 12 at the time of recording and the pulse driving of the semiconductor laser 12 at the time of power setting, it is possible to accurately control the optical output of the semiconductor laser 12 pulse-driven with a plurality of set values.

Incidentally, in the present embodiment, the optical powers are set by the power reference currents IREFP, IREFE, and IREFC as current signals from the reference current generating unit 32. When the reference current generating unit 32 is replaced with a reference voltage generating unit providing optical power setting voltages corresponding to the optical powers and the current switch 35 is replaced with a voltage selector switch, control can be performed as in the above description so that the values obtained by converting the peak level, the average level, and the bottom level of the detection current IFPD as the power detection signal from the photodiode 16 into voltage signals by the current-to-voltage converting unit 26 equal the respective voltages set by the reference voltage generating unit.

<Details of Level Detection and Detected Output Comparison Units; First Embodiment>

Figure 2:
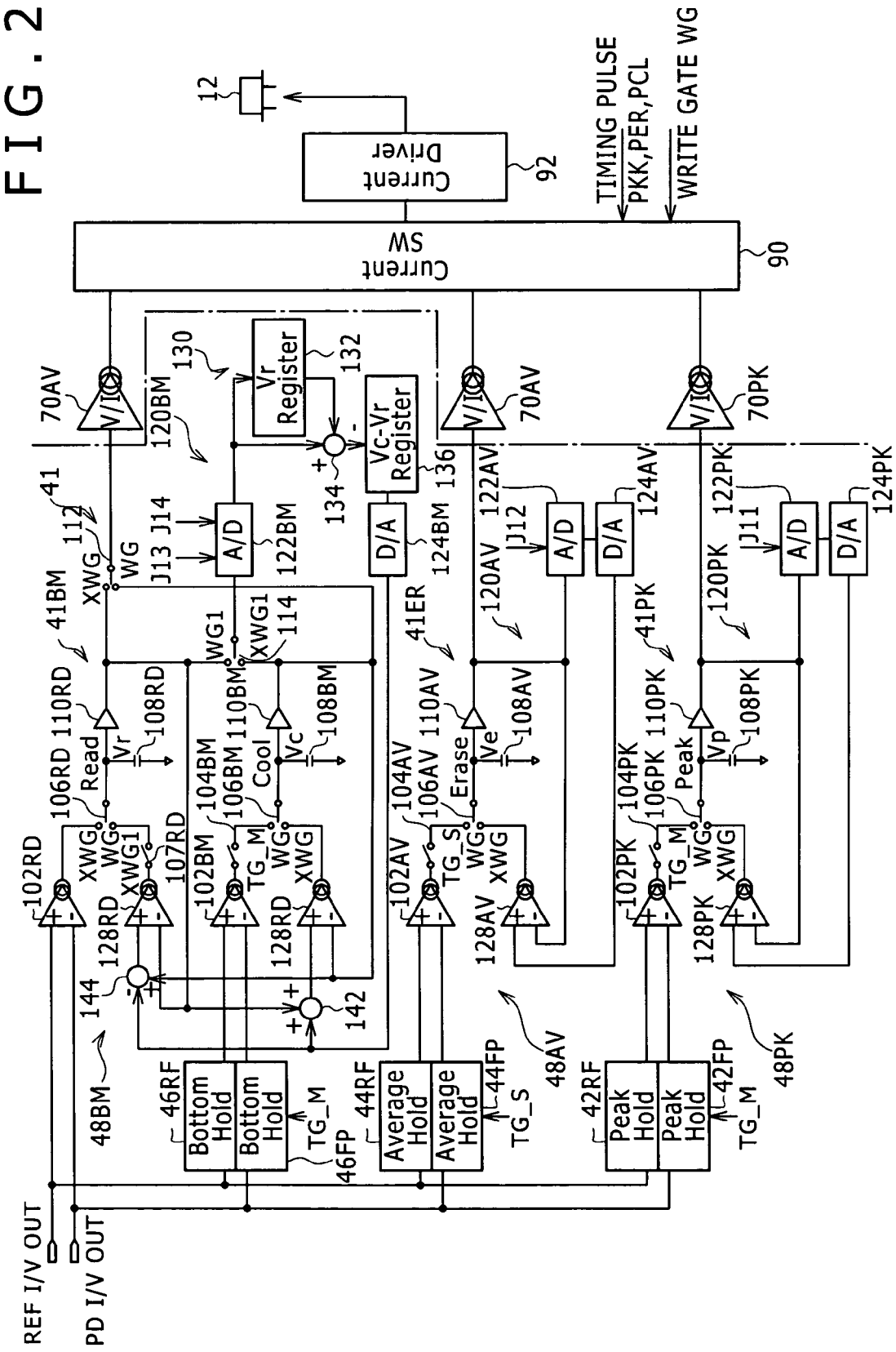
FIG. 2 is a block diagram of assistance in explaining a first embodiment of detailed configuration of level detection and detected output comparison units.

FIG. 2 is a block diagram of assistance in explaining a first embodiment of detailed configuration of the level detection and detected output comparison units 41PK, 41AV, and 41BM.

The level detection and detected output comparison unit 41PK includes: a level detecting part 42 (42FP and 42RE) for detecting the peak (upper side head value) voltages VFPPK and VREPK of the detection voltage VFPD and the power reference voltage VREF, respectively; an error amplifying part 48PK as an example of a detected output comparing part for comparing the corresponding detected voltages detected by the level detecting parts 42FP and 42RE with each other, and generating the error voltage ΔVPK between the detected voltages as a control voltage; and an initial current value adjusting part 120PK for setting an initial value at a time of a mode change.

The error amplifying part 48PK is of an integrator (gm–C) configuration that determines the control band of the APC loop. For example, the error amplifying part 48PK includes: an error amplifying part 102PK for comparing the corresponding detected voltages detected by the level detecting parts 42FP and 42RE with each other, and generating the error voltage ΔVPK between the detected voltages as a control voltage; and a switch 104PK for turning on the APC loop for the peak power at a mark part under a control signal TG_M as an example of an APC gate pulse. The error amplifying part 48PK further includes: a switch 106PK of a two-input-one-output type for performing switching operation under the write gate signal WG (Write Gate) for switching between the recording (Write) mode and the reproduction (Read) mode; an integrator 108PK; and a buffer amplifier 110PK having a buffer function for a voltage retained by the integrator 108PK. The output signal (error voltage ΔVPK) of the buffer amplifier 110PK is input to a voltage-to-current converting part 70PK.

The initial current value adjusting part 120PK includes: an AD converting part (A/D) 122PK for converting an analog voltage retained by the integrator 108PK and output via the buffer amplifier 110PK into digital data; a DA converting part (D/A) 124PK for converting the peak data digitized by the AD converting part 122PK into an analog voltage; and an error amplifying part 128PK.

The AD converting part 122PK is supplied with a control signal J11 (Peak A/D Enable) for controlling AD conversion operation. The AD converting part 122PK subjects the output signal Vp of the integrator 108PK to AD conversion only when the control signal J11 is active.

The inverting input terminal (−) of the error amplifying part 128 is supplied with the output signal of the buffer amplifier 110PK, that is, the input signal of the AD converting part 122PK, and the non-inverting input terminal (+) of the error amplifying part 128 is supplied with the output signal of the DA converting part 124PK.

The write gate signal WG (Write Gate) takes a positive logic XWG in a reproduction section, and a positive logic WG in a recording section. Under the write gate signal WG, the switch 106PK selects the output signal of the error amplifying part 102PK which signal is input to a terminal on a positive logic WG side in a recording section, and selects the output signal of the error amplifying part 128PK which signal is input to a terminal on a positive logic XWG side in a reproduction section.

The level detection and detected output comparison unit 41AV for controlling the erase power Pe has exactly the same configuration as the level detection and detected output comparison unit 41PK. Detailed description of the level detection and detected output comparison unit 41AV will be omitted. In the figure, "AV" is used as reference characters added to an end of a reference numeral of each function part of the level detection and detected output comparison unit 41AV.

A switch 104AV turns on the APC loop for the erase power at a space part under a control signal TG_S as an example of an APC gate pulse. An AD converting part 122AV is supplied with a control signal J12 (Erase A/D Enable) for controlling AD conversion operation. The AD converting part 122AV subjects the output signal Ve of an integrator 108AV to AD conversion only when the control signal J12 is active.

On the other hand, the level detection and detected output comparison unit 41BM has the same function elements as the level detection and detected output comparison unit 41PK, and function elements for correcting an initial value at a time of a mode change.

For example, the level detection and detected output comparison unit 41BM includes: a level detecting part 46 (46FP and 46RE) for detecting the bottom voltages VFPBM and VREBM of the detection voltage VFPD and the power reference voltage VREF, respectively, the bottom voltages VFPBM and VREBM corresponding to the cool level; and an error amplifying part 48BM as an example of a detected output comparing part for comparing the corresponding detected voltages detected by the level detecting parts 46FP and 46RE with each other, and generating the error voltage ΔVBM between the detected voltages as a control voltage.

The error amplifying part 48BM is of an integrator (gm–C) configuration that determines the control band of the APC loop. The error amplifying part 48BM includes: an error amplifying part 102BM for comparing the corresponding detected voltages detected by the level detecting parts 46FP and 46RE with each other, and generating the error voltage ΔVBM between the detected voltages as a control voltage; and a switch 104BM for turning on the APC loop for the cool power at a mark part under the control signal TG_M as an example of an APC gate pulse. The error amplifying part 48BM further includes: a switch 106BM of a two-input-one-output type for performing switching operation under the write gate signal WG; an integrator 108BM; and a buffer amplifier 110BM having a buffer function for a voltage retained by the integrator 108BM.

In addition, the error amplifying part 48BM includes: an error amplifying part 102RD as an example of a detected output comparing part for comparing the read levels VFPRD and VRERD of the detection voltage VFPD and the power reference voltage VREF with each other, and generating the error voltage ΔVRD between the read levels VFPRD and VRERD as a control voltage; a switch 106RD of a two-input-one-output type for performing switching operation under the write gate signal WG; an integrator 108RD; and a buffer amplifier 110RD having a buffer function for a voltage retained by the integrator 108RD. The error amplifying part 102RD and the integrator 108RD form an integrator (gm–C) configuration that determines the control band of the APC loop.

The output signal (error voltage ΔVBM) of the buffer amplifier 110BM and the output signal (error voltage ΔVRD) of the buffer amplifier 110RD are input to the voltage-to-current converting part 70BM via a switch 112. The switch 112 is supplied with the write gate signal WG. When the write gate signal WG is active, the switch 112 selects the output signal of the buffer amplifier 110BM which signal is input to a terminal on a positive logic WG side. On the other hand, when the write gate signal WG is inactive, the switch 112 selects the output signal of the buffer amplifier 110RD which signal is input to a terminal on a negative logic XWG side.

The output signal (error voltage ΔVBM) of the buffer amplifier 110BM and the output signal (error voltage ΔVRD) of the buffer amplifier 10RD are input to an AD converting part 122BM via a switch 114. The switch 114 is supplied with a control signal WG1. When the control signal WG1 is active, the switch 114 selects the output signal of the buffer amplifier 110RD which signal is input to a terminal on a positive logic WG1 side. On the other hand, when the control signal WG1 is inactive, the switch 114 selects the output signal of the buffer amplifier 110BM which signal is input to a terminal on a negative logic XWG1 side.

An initial current value adjusting part 120BM includes: an AD converting part (A/D) 122BM for converting an analog voltage retained by the integrator 108BM or 108RD and output via the buffer amplifier 110BM or h0RD into digital data; a DA converting part (D/A) 124BM for converting the data digitized by the AD converting part 122BM into an analog voltage; and error amplifying parts 128BM and 128RD. The output of the error amplifying part 128RD is connected to one input terminal (positive logic WG side) of the switch 106RD via a switch 107RD.

The AD converting part 122BM is supplied with a control signal J13 (Cool A/D Enable) and a control signal J14 (Read A/D Enable) for controlling AD conversion operation. The AD converting part 122BM subjects the output signal Vc of the integrator 108BM to AD conversion only when the control signal J13 is active, and subjects the output signal Vr of the integrator 108RD to AD conversion only when the control signal J14 is active.

The initial current value adjusting part 120BM of the level detection and detected output comparison unit 41BM includes: an initial value correction amount calculating part 130 for calculating an amount of correction of an initial value at a time of a mode change in consideration of the threshold current Ith of the laser, the initial value correction amount calculating part 130 being disposed between the AD converting part 122BM and the DA converting part 124BM; and an initial value correcting part 140 for correcting the initial value on the basis of the amount of correction calculated by the initial value correction amount calculating part 130, the initial value correcting part 140 being disposed on the non-inverting input (+) side of the error amplifying parts 128BM and 128RD.

As will be described later in detail, the initial value correction amount calculating part 130 determines the amount of correction on the basis of a difference between the cool current and the read current including information on the threshold current Ith at times immediately before and immediately after a mode transition at which times a temperature drift of the laser does not occur, and the read current immediately before the transition in the case of the mode transition from reproduction to recording, or the cool current immediately before the transition in the case of the mode transition from recording to reproduction. The initial value correction amount calculating part 130 thus makes it possible to set the initial values of the read current and the cool current including a variation component ΔIth of the threshold current Ith.

The initial value correction amount calculating part 130 includes: a register (Vr Register) 132 for retaining a digital value converted by the AD converting part 122BM, specifically the integrator output Vr (a digital value Dr thereof) as a read current indicating voltage; a subtracting part 134 for obtaining a difference between a digital value converted by the AD converting part 122BM, specifically the integrator output Vc (a digital value Dc thereof) as a cool current indicating voltage and the integrator output Vr retained in the register 132; and a register 136 for retaining the difference (Vc−Vr) obtained by the subtracting part 134. The difference data retained by the register 136 is input to the DA converting part 124BM.

The initial value correcting part 140 includes: an adding part 142 for adding together the output signal of the buffer amplifier 110RD and the difference (Vc−Vr) from the DA converting part 124BM, the adding part 142 being on the non-inverting input (+) side of the error amplifying part 128BM; and a subtracting part 144 for subtracting the difference (Vc−Vr) from the DA converting part 124BM from the output signal of the buffer amplifier 110BM, the subtracting part 144 being on the non-inverting input (+) side of the error amplifying part 128RD.

<Light Emission Pulse Waveform and Switching Control Signals>

Figure 3A:
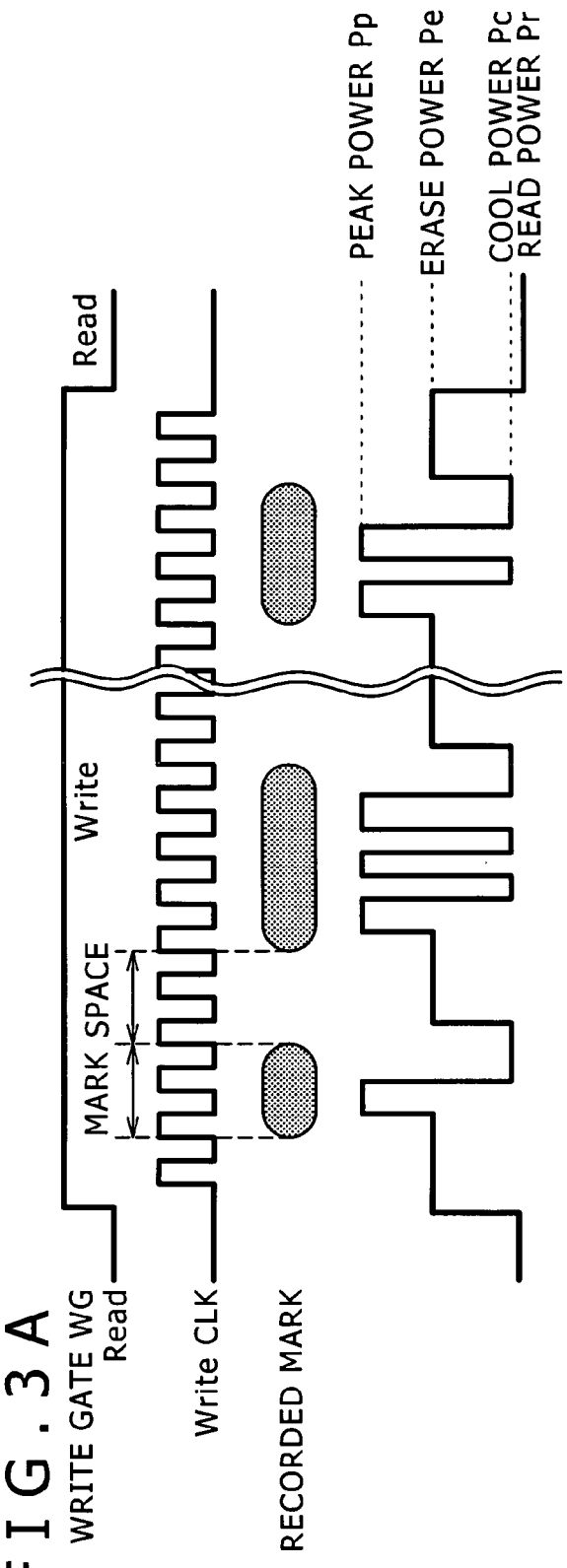
FIGS. 3A and 3B are timing charts of assistance in explaining a relation between the light emission pulse waveform of a semiconductor laser and switching control signals input to a current switch which signals correspond to power levels in the light emission pulse waveform.
Figure 3B:
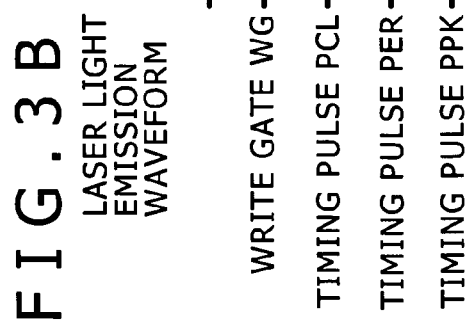

FIGS. 3A and 3B are timing charts of assistance in explaining a relation between the light emission pulse waveform of the semiconductor laser 12 and the switching control signals input to the current switch 35 which signals correspond to the power levels of the light emission pulse waveform. FIG. 4 is a timing chart of assistance in explaining the laser driving current flowing to the semiconductor laser 12 driven in timing shown in FIGS. 3A and 3B.

The semiconductor laser 12 incorporated in the optical system device 10 such as an optical pickup or the like irradiates the optical disk 9 with light. At a time of reproduction, weak reproduction light is condensed on the optical disk 9, and the reflectivity, phase difference, deflection angle and the like of pits recorded on the optical disk 9 are detected.

At times of recording and erasure, the semiconductor laser 12 emits light with higher power than at the time of reproduction. At this time, simple on/off control of laser power in correspondence with a digital signal itself desired to be recorded results in a great distortion of a recorded mark waveform being affected by thermal accumulation and the like, causing a read error at a time of reproduction.

Thus, in order to prevent data errors due to mark shape distortion in mark edge recording, the write strategy technique for controlling thermal distribution occurring in recorded marks by subjecting laser power to pulse modulation according to the marks to be recorded is employed, while the APC system real-time control for real-time control of each laser power of the strategy of the phase change disk is employed.

For example, when control is performed with three values to enable overwriting at a time of recording using the phase change optical disk as the optical disk 9, as shown in FIG. 3A, a modulated waveform is used in which pulse width modulation and intensity modulation are combined, and a plurality of laser pulses having three power levels such as the peak power Pp, the erase power Pe, and the cool power Pc in order of decreasing power level are used. By changing the number of pulses according to length of a mark desired to be created, and optimally setting pulse width and level, thermal interference between created marks adjacent to each other and thermal accumulation at a rear end part of a created mark are reduced, and thus optimum recorded marks are formed. Thereby excellent recorded and reproduced RF signals can be obtained.

Specifically, by switching between the three values of the peak power Pp, the erase power Pe, and the cool power Pc on the basis of a write clock (Write CLK), a mark is recorded by peak power parts and cool power parts, and a mark recorded on a substrate is erased, that is, a space part is recorded by an erase power part. Incidentally, while the read power is not used at the time of recording, a total of four laser power setting values are required when read power Pr representing laser power for reproduction is taken into consideration.

At a mark part, a plurality of laser power values such as the peak power Pp and the cool power Pc are set, and the plurality of laser power values are subjected to pulse modulation. Thereby heat to which the mark being recorded is subjected is made uniform, and thus a stable recorded mark is formed. That is, application of laser light with a recording waveform formed by the laser light divided into a plurality of short pulses prevents heat accumulation at the rear end part of the mark being recorded, and prevents a teardrop shape phenomenon of the recorded mark (the rear part of the recorded mark is wider than the front part of the recorded mark), thus reducing distortion of the recorded mark.

For such current switching control, the switching control signals for switching semiconductor laser power are input to the current switch 35. While there are various methods conceivable for generating the laser light emission waveform on the phase change disk as shown in FIG. 3A by the current switch 35, the present embodiment employs a method of obtaining a desired laser driving current waveform by superimposing the erase current Ie and the peak current Ip on the cool current Ic.

In this case, as shown in FIG. 3B, a timing pulse PPK indicating output of the peak current Ip providing the peak power Pp, a timing pulse PER indicating output of the erase current Ie providing the erase power Pe, and a timing pulse PCL indicating output of the cool current Ic providing the cool power Pc are output in the form of an active H (high level) during a high-level period of the write gate signal WG.

As described above, the current switch 35 has individual current sources corresponding to the peak power level, the erase power level, the cool power level, and the read power level, respectively, and switching elements turned on and off under control of the write gate signal WG and the timing pulses PPK, PER, and PCL.

For example, at a time of a read mode, only the read switching element is brought into an on state in response to the low level of the write gate signal WG, so that the power reference current IREFR set at the read current source is output as the power reference current IREF from the current switch 35. Thus a read current ILDR providing the read power Pr corresponding to the power reference current IREFR is supplied to the semiconductor laser 12.

Similarly, at a time of a write mode, when the timing pulse PCL in an active H state indicating output of the cool current Ic is first input to the current switch 35, the cool switching element is brought into an on state in response to the high level of the write gate signal WG, so that the current Ic corresponding to the power reference current IREFC set at the cool current source is output from the current switch 35. Next, when the timing pulse PER in an active H state indicating output of the erase current Ie is input to the current switch 35., the erase switching element is brought into an on state, so that the current Ie corresponding to the power reference current IREFE set at the erase current source is output from the current switch 35.

Figure 4:
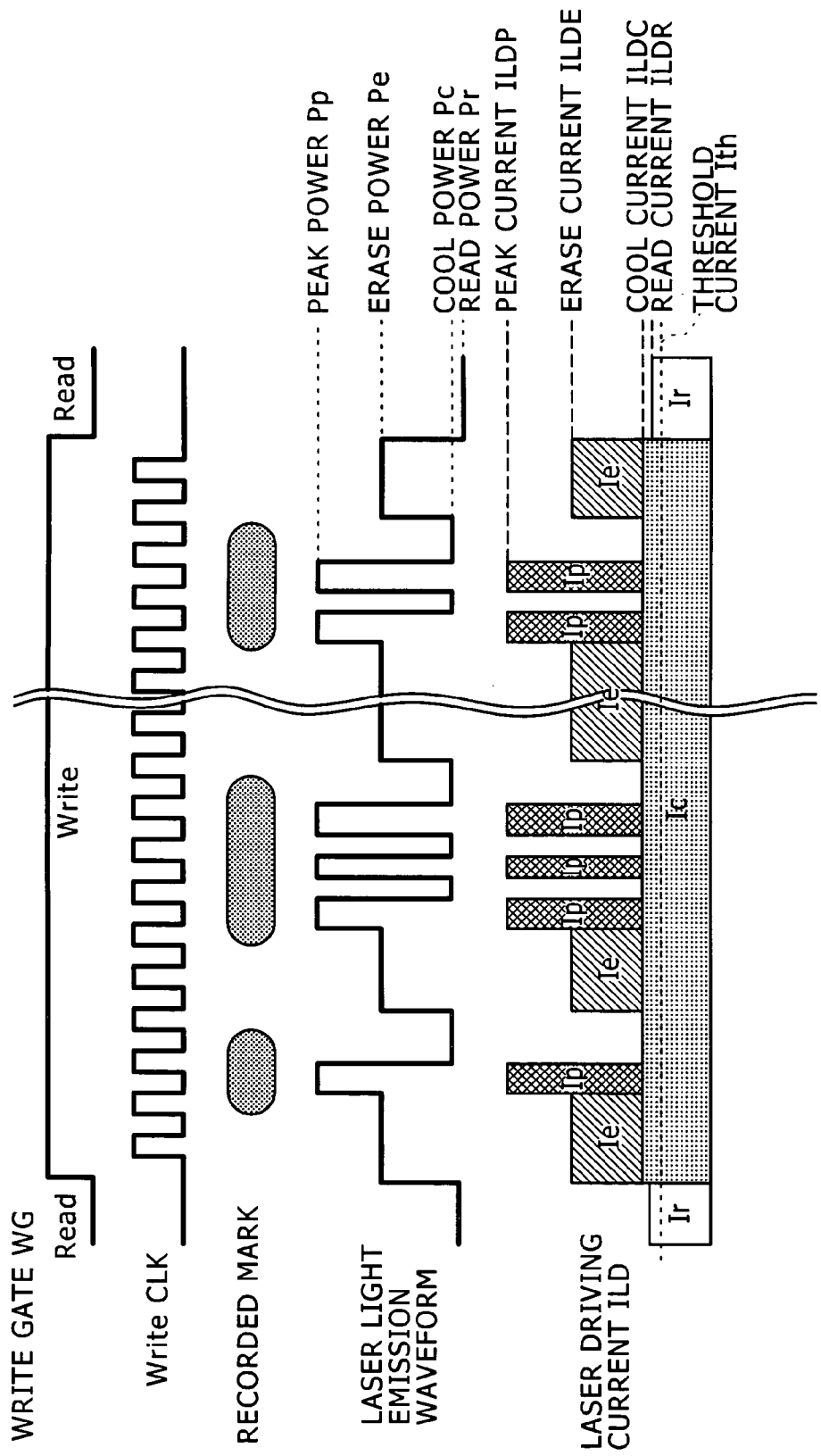
FIG. 4 is a timing chart of assistance in explaining a laser driving current flowing to the semiconductor laser driven in timing shown in FIGS. 3A and 3B.

At this time, as shown in FIG. 4, as to the power reference current IREF output from the current switch 35, the current Ic of the cool current source functions as bias current providing the threshold current Ith of the laser, the current Ie of the erase current source is superimposed on the current Ic of the cool current source, and a component obtained by combining both the currents Ic and Ie with each other flows as an erase current ILDE. Consequently, the laser power of the semiconductor laser 12 is increased.

Similarly, in the write mode, when the timing pulse PPK in an active H state indicating output of the peak current Ip is input to the current switch 35, the peak switching element is brought into an on state, so that the current Ip corresponding to the power reference current IREFP set at the peak current source is output from the current switch 35.

At this time, as shown in FIG. 4, as to the power reference current IREF output from the current switch 35, the current Ic of the cool current source functions as bias current providing the threshold current Ith of the laser, the current Ip of the peak current source is superimposed on the current Ic of the cool current source, and a component obtained by combining both the currents Ic and Ip with each other flows as a peak current ILDP. Consequently, the laser power of the semiconductor laser 12 is increased.

That is, in the laser driving current ILD as a whole, as shown in FIG. 4, the current Ic provided by the cool current source forms a bias component, and the current Ie defining the erase current ILDE or the current Ip defining the peak current ILDP is superimposed on the current Ic as the bias component. Thereby a light emission waveform of multi-level power can be generated.

When the optical disk 9 is irradiated with laser light of the peak power Pp while the write strategy technique is used as shown in FIG. 4, a recording film of the optical disk 9 is melted. When the laser light is then changed to the cool power Pc for quick cooling (cool level), the recording film assumes an amorphous state having a low light reflectivity. This is used as a recorded mark.

When the optical disk 9 is irradiated with laser light of the erase power Pe, the recording film assumes a crystalline state. A part that has been in an amorphous state before the irradiation with the laser light changes into a crystalline state, and a part that has originally been in a crystalline state remains in a crystalline state.

Thereby recorded marks can be erased, so that overwriting (rewriting) is made possible. The cool power Pc is generally set to a low power because of a purpose of the cool power Pc, and may be considered to be about the same as the read power Pr as output at the time of reproduction as described above.

Incidentally, at the time of reproduction, the optical disk 9 is irradiated with converged light of the semiconductor laser 12 to obtain an information signal and a servo signal from the optical disk 9. Therefore a certain amount of light reflected from the optical disk 9 returns to the semiconductor laser 12 side. Thus, a scoop noise and a mode hopping noise (referred to collectively as laser noise) due to interference between the returned light and irradiation light occur, which is a factor in causing a C/N (Carrier to Noise) degradation of a reproduced signal.

Accordingly, a high-frequency superimposition method of superimposing a high-frequency current of 200 MHz to 600 MHz on the direct bias current of the semiconductor laser 12 is used in the reproduction mode for a purpose of reducing the laser noise. However, even when the high-frequency superimposition method is used, the current may be considered to be basically a DC, and is the same as in FIG. 13.

At a time of recording, on the other hand, peak detection and bottom detection are performed in timing of a mark part on the basis of the APC gate to control the peak power and the cool power, and average value detection is performed in timing of a space part to control the erase power.

However, even with real-time APC, a loop band is limited. Therefore, when a target setting power is changed, a pull-in time for responding to the change is required.

For example, when a method of obtaining a desired laser driving current waveform as shown in FIG. 4 by superimposing the erase current Ie and the peak current Ip on the cool current Ic is used, the method being considered to be the simplest and rational as a method for generating the laser light emission waveform as shown in FIGS. 3A and 3B on the phase change disk by the current switch, supposing that an ordinary APC control configuration is employed without the initial current value adjusting part 120 being provided, no problem is presented in a case of a temperature drift of the laser at the same light emission power. However, at a time of a mode transition from recording to reproduction or from reproduction to recording, in particular, there is an APC pull-in interval in which a difference from a desired power is large, presenting a large problem in achieving higher density and higher transfer rate.

Using a laser driving current pulled in previously as an initial value at a time of a mode transition is conceivable. However, in reproduction after recording for a long period of time or recording after reproduction for a long period of time, a temperature drift of the light emission threshold value due to a difference in heat generated by the laser itself and a change in an ambient temperature because of a large difference in laser output between the time of recording and the time of reproduction as described earlier greatly affects the initial value.

On the other hand, the present embodiment has the initial current value adjusting part 120 to set the initial value of laser power so as to eliminate the effect of the temperature drift of the threshold current of the laser at a time of a mode transition from recording to reproduction or from reproduction to recording when the APC system that controls a plurality of laser powers of a waveform being recorded on a phase change disk is used. It is thereby possible to increase laser power accuracy at the time of the mode transition and consequently reduce a pull-in time. This point will be described in the following.

Figure 5:
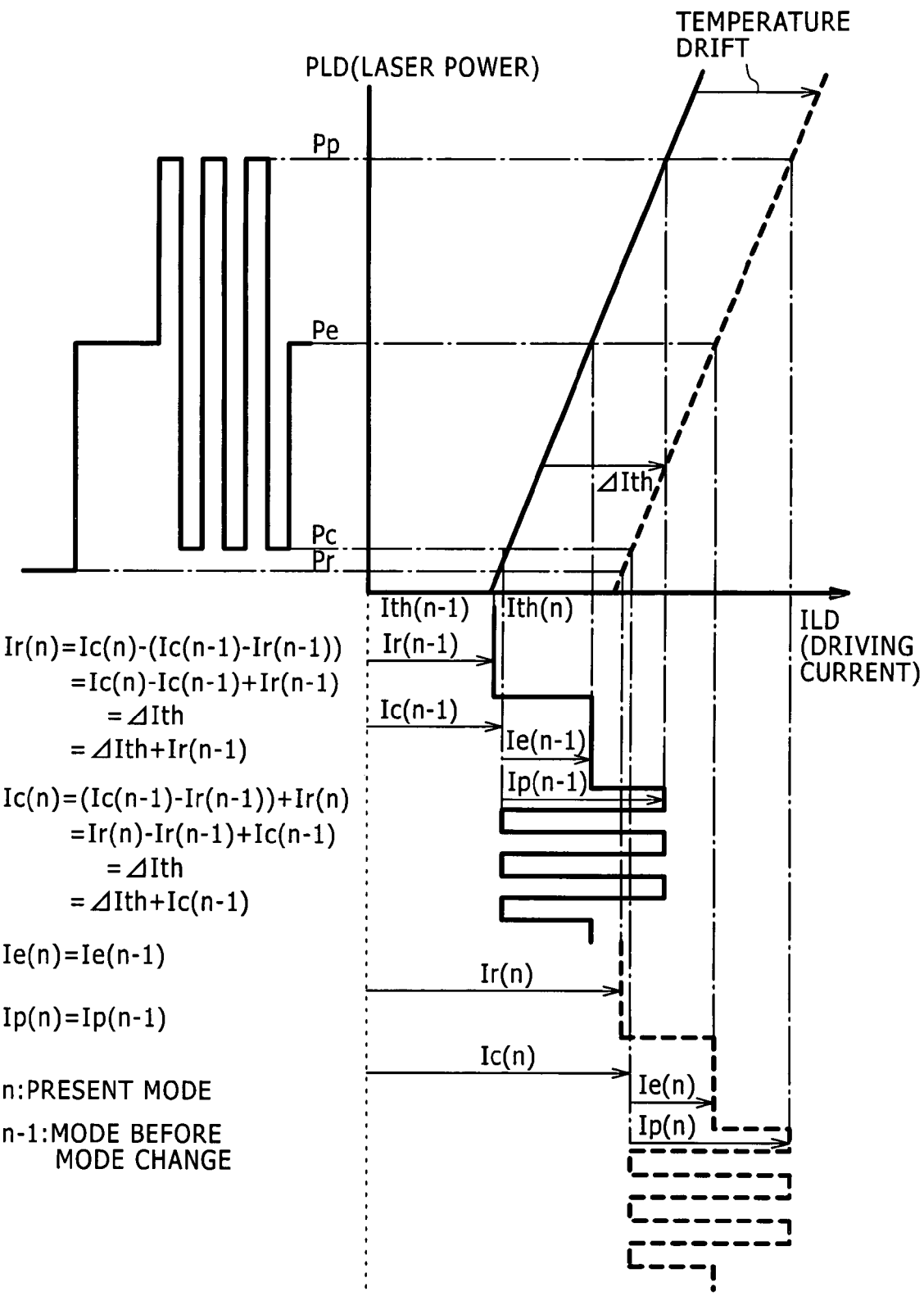
FIG. 5 is a diagram of assistance in explaining the effect of a cool current error in a pull-in process.

FIG. 5 is a diagram of assistance in explaining the above-described problem and a method of solving the problem. When a desired laser driving current waveform is obtained by superimposing the erase current Ie and the peak current Ip on the cool current Ic as shown in FIG. 4, information on the threshold current Ith of the laser is included in the read current Ir and the cool current Ic.

FIG. 5 shows driving currents for obtaining respective desired laser light emission powers in a case of different laser threshold currents Ith(n−1) and Ith(n)=Ith(n−1)+ΔIth. For example, the read current is denoted by Ir(n−1) and Ir(n). Symbols are similarly assigned to the driving currents for the other powers.

When a difference Ic−Ir between the cool current and the read current at the time of the same laser threshold current is obtained, the read current can be calculated from the cool current and the cool current can be calculated from the read current by the following equations (2) even when the threshold current is changed.

[Equation 2]

$$\begin{aligned}Ir(n) &= Ic(n) - (Ic(n-1) - Ir(n-1)) \\ &= (Ic(n) - Ic(n-1)) + Ir(n-1) \\ &= \Delta Ith \\ &= \Delta Ith + Ir(n-1) \\ Ic(n) &= (Ic(n-1) - Ir(n-1) + Ir(n)) \\ &= (Ir(n) - Ir(n-1)) + Ic(n-1) \\ &= \Delta Ith \\ &= \Delta Ith + Ic(n-1)\end{aligned} \quad (2)$$

Since the erase current and the peak current at the time of recording are not changed under a condition of a varying threshold current, the erase current and the peak current may be obtained by the following equations (3). This is because a desired laser driving current waveform is obtained by superimposing the erase current Ie and the peak current Ip on the cool current Ic.

[Equation 3]

$$\left.\begin{aligned}Ie(n) &= Ie(n-1) \\ Ip(n) &= Ip(n-1)\end{aligned}\right\} \quad (3)$$

<Operation of Level Detection and Detected Output Comparison Units; First Embodiment>

Figure 6:
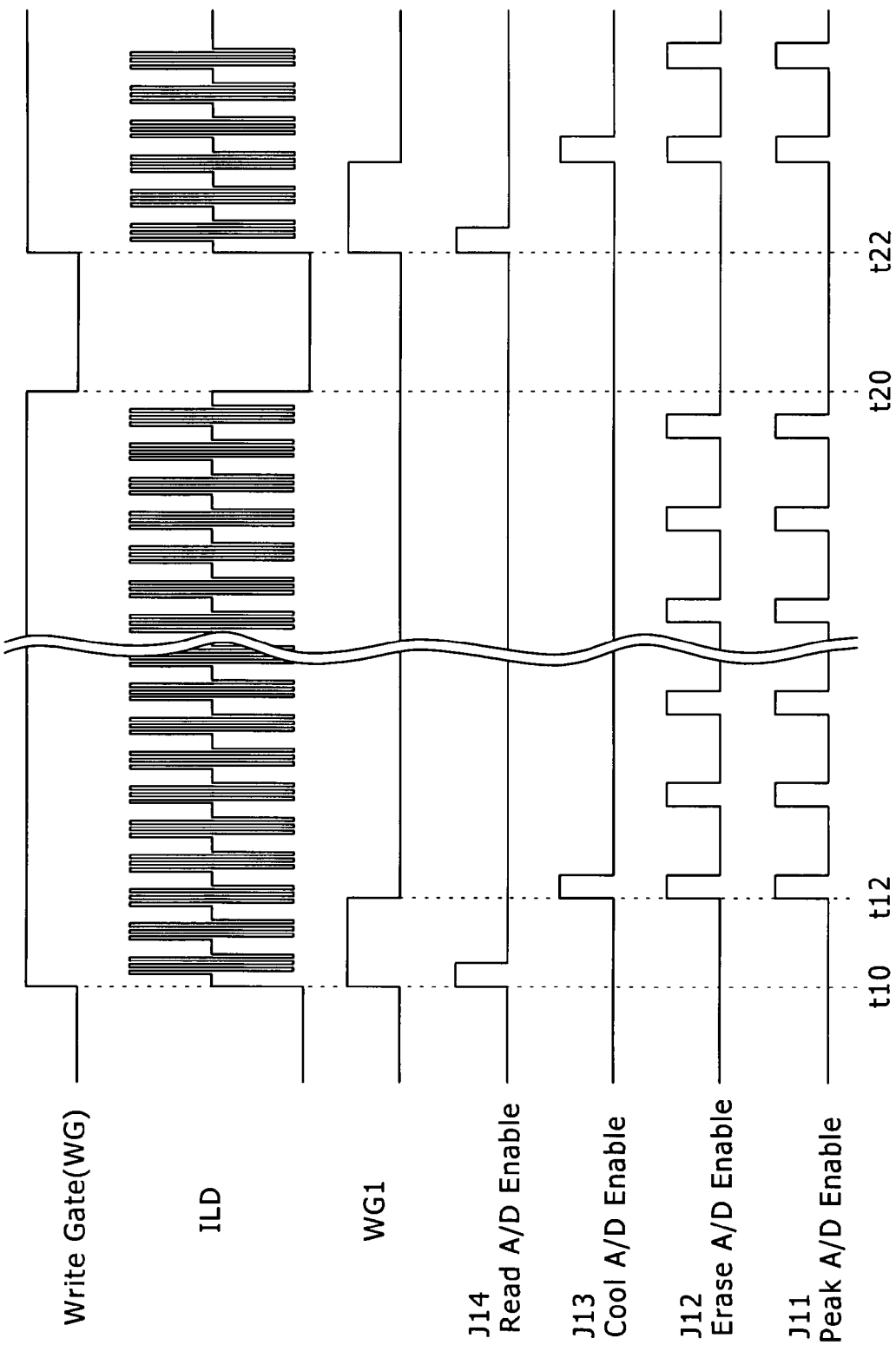
FIG. 6 is a timing chart of assistance in explaining operation of the level detection and detected output comparison units shown in FIG. 2.

FIG. 6 is a timing chart of assistance in explaining operation of the level detection and detected output comparison units 41 shown in FIG. 2. First, in timing of switching from the reproduction mode to the recording mode (t10), the control signal WG1 is activated, the integrator 108BM holds a read current indicating voltage Vr, the AD converting part 122BM converts the output Vr into digital data, and the register 132 temporarily holds the digital data.

An interval (WG1) from t10 to t12 during which the control signal WG1 is active is used for a pull-in time of each power for recording. This interval is a relatively short time immediately after the mode transition, so that it may therefore be assumed that a temperature drift of the laser does not occur before and after the mode transition. The interval is thus a time free from the effect of a temperature drift of the laser.

Thus, when information for initial value adjustment is acquired by obtaining a bias current component including information on the threshold current in each operation mode and obtaining the difference within a predetermined period in which a temperature drift does not occur (does not tend to occur) before and after a mode transition, that is, in which a temperature drift of the laser is practically negligible, initial value adjustment can be made more appropriately.

Next, the control signal WG1 is inactivated (XWG1) (t12), the integrators 108PK, 108AV, and 108BM hold the cool current indicating voltage, the erase current indicating voltage, and the peak current indicating voltage, and the AD converting parts 122BM, 122AV, and 122PK convert the outputs Vc, Ve, and Vp into digital data.

The subtracting part 134 performs a digital subtraction process between the integrator output Vc after AD conversion and the integrator output Vr after AD conversion which output has previously been stored in the register 132, and stores an obtained difference (Vc@t12−Vr@t10) as digital data in the register (Vc−Vr register) 136.

During a recording interval through t20 after the inactivation of the control signal WG1 (t12), the subtracting part 144 performs an analog subtraction process between the output Vc (actually via the buffer amplifier 110BM) of the integrator 108BM for cool power control and a value (Vc@t12−Vr@t10) obtained by subjecting the difference data Vc@t12−Vr@t10 retained in the register 136 to DA conversion by the DA converting part 124BM. In timing of switching from the recording mode to the reproduction mode (t20), an obtained difference Vc@t20−(Vc@t12−Vr@t10) is used as a voltage indicating an initial value of the read current Ir.

That is, at the time of the mode transition from recording to reproduction, from a driving current immediately before the mode transition, that is, the cool current Ic of two kinds of currents including the laser driving threshold current in the recording mode and the reproduction mode, specifically the read current Ir and the cool current Ic providing the bias current at the time of recording, another laser driving current after the mode transition, that is, the read current Ir (voltage corresponding to the read current Ir) is calculated. The voltage is used as a voltage for setting the initial value of the read current Ir.

The integrator outputs as voltages indicating the erase current Ie and the peak current Ip, respectively, are subjected to AD conversion by the AD converting parts 122AV and 122PK during the recording interval after t12.

During a reproduction interval from t20 to t22, the adding part 142 performs an analog addition process between the output of the integrator 108RD for read power control, that is, the error output Vr of the error amplifying part 102RD and a value (Vc@t12−Vr@t10) obtained by subjecting the difference data Vc@t12−Vr@t10 retained in the register 136 to DA conversion by the DA converting part 124BM. In timing of switching from the reproduction mode to the recording mode (t22), an obtained addition result Vc@t22+(Vc@t12−Vr@t10) is used as a voltage indicating an initial value of the cool current Ic.

That is, at the time of the mode transition from reproduction to recording, from a driving current immediately before the mode transition, that is, the read current Ir of two kinds of currents including the laser driving threshold current in the recording mode and the reproduction mode, specifically the read current Ir and the cool current Ic providing the bias current at the time of recording, another laser driving current after the mode transition, that is, the cool current Ic (voltage corresponding to the cool current Ic) is calculated. The voltage is used as a voltage for setting the initial value of the cool current Ic.

On the other hand, as for the erase current Ie and the peak current Ip, data subjected to AD conversion by the AD converting parts 122AV and 122PK at the end of the previous recording interval is subjected to DA conversion by the DA converting parts 124AV and 124PK to be used for setting respective initial values of the erase current Ie and the peak current Ip.

That is, as to the currents other than the bias current component in each of the reproduction mode and the recording mode (the read current Ir and the cool current Ic in this example), as the initial values of the driving currents for driving the laser in the present operation mode, the driving currents in the previous identical mode are used. As one example, when the write strategy technique using multi-pulse modulation with three values is employed, the erase current Ie and the peak current Ip providing current pulses correspond to the currents "other than the bias current component in each of the modes." Driving with more values is possible, and a similar notion may be applied in that case.

A temperature variation component of the light emission threshold value Ith in light emission characteristics of the laser dependent on the temperature is completely removed from the initial values of these laser powers. It is therefore possible to emit light accurately with desired laser powers from a start of a mode.

Thus, by setting the initial value for APC control at the time of a mode change using a difference between two laser driving currents (the read current Ir and the cool current Ic in this example) of different magnitudes including the threshold current Ith of the driving current ILD for driving the laser, on the basis of one driving current of the two laser driving currents, the initial value of the other driving current can be calculated and set in a form of being corrected for a temperature drift of the threshold current of the laser even under a condition where the threshold current of the laser is changed.

It is thereby possible to prevent the effect of a temperature drift of the threshold current of the laser on the setting of the initial value of laser power at the time of a mode transition from recording to reproduction or from reproduction to recording in laser light output control (APC) for a writable optical disk. Consequently laser power accuracy at the time of a mode transition can be increased greatly. In addition, since a proper initial value can be given at the time of a mode transition, an APC pull-in time can be reduced significantly.

It is thereby possible to significantly reduce an unnecessary disk area for avoiding problems such as inability to perform recording by consecutive writing, erasure of recorded marks in reproduction, inability to read recorded marks, and the like due to a shift in laser power from desired power. Thus higher density and higher transfer rate can be achieved easily.

<Details of Level Detection and Detected Output Comparison Units; Second Embodiment>

Figure 7:
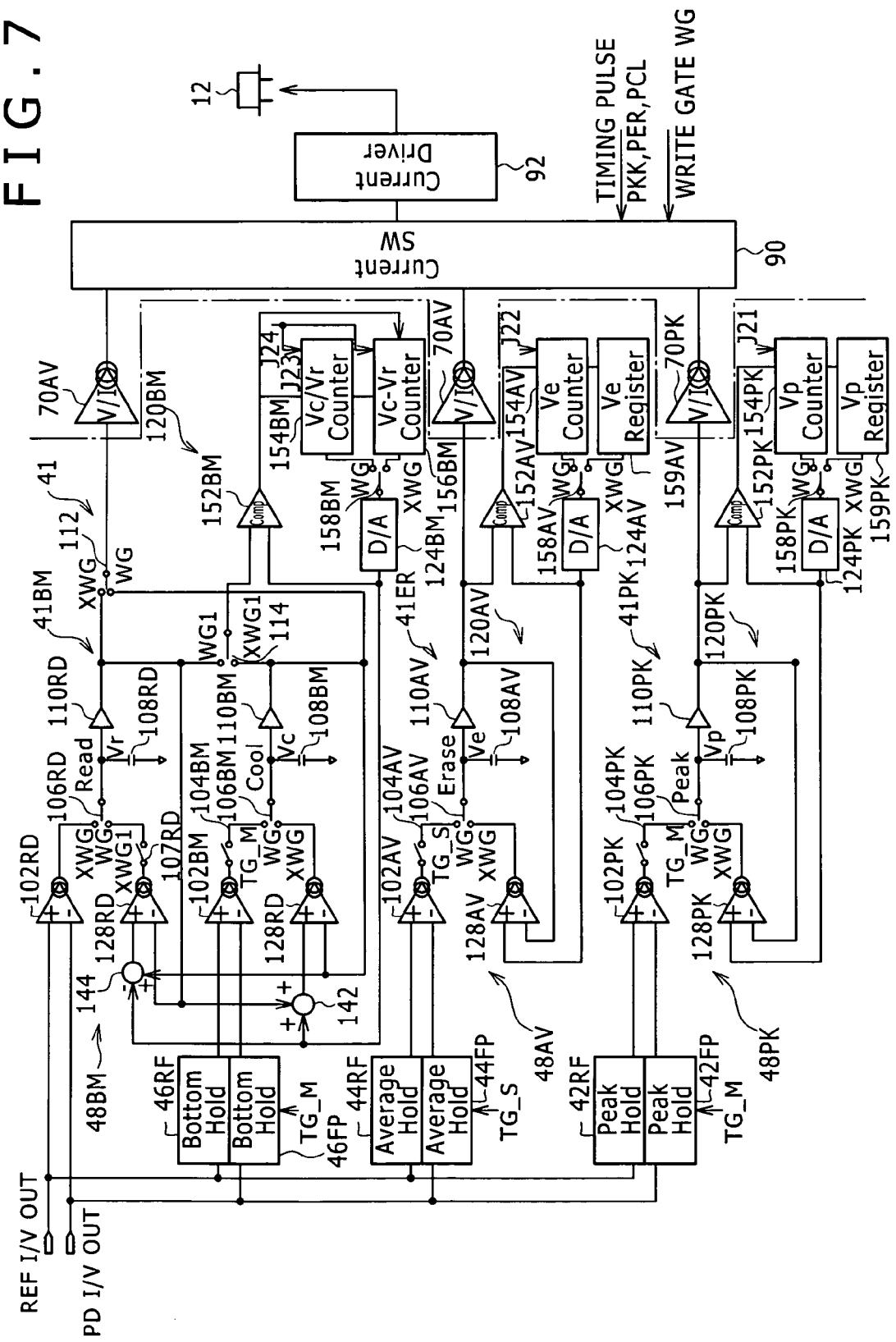
FIG. 7 is a block diagram of assistance in explaining a second embodiment of detailed configuration of the level detection and detected output comparison units.

FIG. 7 is a block diagram of assistance in explaining a second embodiment of detailed configuration of the level detection and detected output comparison units 41PK, 41AV, and 41BM. The second embodiment is characterized by being formed with a sequential comparison type AD converting part in which the AD converting part 122 and the initial value correction amount calculating part 130 are integrated, a DA output for initial value setting is swept by a counter, and data at a point of coincidence of comparator inputs is latched.

As shown in the figure, an initial current value adjusting part 120BM includes: a comparator 152BM for comparing an analog voltage retained in an integrator 108BM and output via a buffer amplifier 110BM and a switch 114 with an analog voltage from a DA converting part 124BM; a first counter 154BM starting count operation in predetermined timing and latching a count value at a point of coincidence of inputs to the comparator 152BM; a second counter 156BM starting count operation in predetermined timing and latching a count value at a point of coincidence of inputs to the comparator 152BM; and a switch 158BM for selecting one of the output of the first counter 154BM and the output of the second counter 156BM and inputting the selected output to the DA converting part 124BM under control of a write gate signal WG.

The switch 158BM selects the count output of the first counter 154BM which output is input to a terminal on a positive logic WG side of the switch 158BM when the write gate signal WG is active, and selects the count output of the second counter 156BM which output is input to a terminal on a negative logic XWG side of the switch 158BM when the write gate signal WG is inactive. The switch 158BM inputs the selected output to the DA converting part 124BM.

The first counter 154BM is supplied with a control signal J23 (Read A/D Enable) and a control signal J24 (Cool-Read A/D Enable) for controlling count operation for AD conversion. The first counter 154BM performs count operation only when one of the control signals J23 and J24 is active.

The first counter 154BM starts count operation when the control signal J23 or J24 becomes active. The first counter 154BM latches (retains) a count value when the comparator 152BM finds a point in time at which the output signal Vr of an integrator 108RD or the output signal Vc of the integrator 108BM coincides with a voltage value obtained by converting a count result of the first counter 154BM into an analog value by the DA converting part 124BM.

Also, the first counter 154BM supplies the second counter 156BM with the two's complement of a count value latch result at a point in time at which the output signal Vr of the integrator 108RD coincides with a voltage value obtained by converting a count result of the first counter 154BM into an analog value by the DA converting part 124BM.

The second counter 156BM is supplied with the control signal J24 (Cool-Read A/D Enable) for controlling count operation for AD conversion. The second counter 156BM performs count operation only when the control signal J24 is active. The second counter 156BM receives the latch result of the first counter 154BM as the two's complement (that is, a negative value) and sets the latch result of the first counter 154BM as an initial value, and starts count operation when the control signal J24 becomes active.

While the second counter 156BM performs count operation, the first counter 154BM performs count operation under the control signal J24. Consequently, the second counter 156BM latches (retains) a count value of the second counter 156BM itself when the comparator 152BM finds a point in time at which the output signal Vc of the integrator 108BM coincides with a voltage value obtained by converting a count result of the first counter 154BM into an analog value by the DA converting part 124BM.

An initial current value adjusting part 120AV includes: a comparator 152AV for comparing an analog voltage retained in an integrator 108AV and output via a buffer amplifier 110AV with an analog voltage from a DA converting part 124AV; a first counter 154AV starting count operation in predetermined timing and latching a count value at a point of coincidence of inputs to the comparator 152AV; a register 159AV for temporarily retaining a count result of the first counter 154AV; and a switch 158AV for selecting one of the output of the first counter 154AV and the output of the register 159AV and inputting the selected output to the DA converting part 124AV under control of the write gate signal WG.

The switch 158AV selects the count output of the first counter 154AV which output is input to a terminal on a positive logic WG side of the switch 158AV when the write gate signal WG is active, and selects the output of the register 159AV which output is input to a terminal on a negative logic XWG side of the switch 158AV when the write gate signal WG is inactive. The switch 158AV inputs the selected output to the DA converting part 124AV.

The first counter 154AV is supplied with a control signal J22 (Erase A/D Enable) for controlling count operation for AD conversion. The first counter 154AV performs count operation only when the control signal J22 is active. The first counter 154AV starts count operation when the control signal J22 becomes active. The first counter 154AV latches (retains) a count value when the comparator 152AV finds a point in time at which the output signal Ve of the integrator 108AV coincides with a voltage value obtained by converting a count result of the first counter 154AV into an analog value by the DA converting part 124AV.

The register 159AV obtains a count value of the first counter 154AV when the write gate signal WG becomes inactive from the first counter 154AV, and retains the count value. This is to correctly retain the last count value of the first counter 154AV in a recording interval (t30 to t40) even when the operation of a recording current IDL and the count operation of the first counter 154AV are asynchronous to each other.

An initial current value adjusting part 120PK has exactly the same configuration as the above-described initial current value adjusting part 120AV. Detailed description of the initial current value adjusting part 120PK will be omitted. In the figure, "PK" is used as reference characters added to an end of a reference numeral of each function part of the initial current value adjusting part 120PK. A first counter 154PK is supplied with a control signal J21 (Peak A/D Enable) for controlling count operation for AD conversion. The first counter 154PK performs count operation only when the control signal J21 is active.

<Operation of Level Detection and Detected Output Comparison Units; Second Embodiment>

Figure 8:
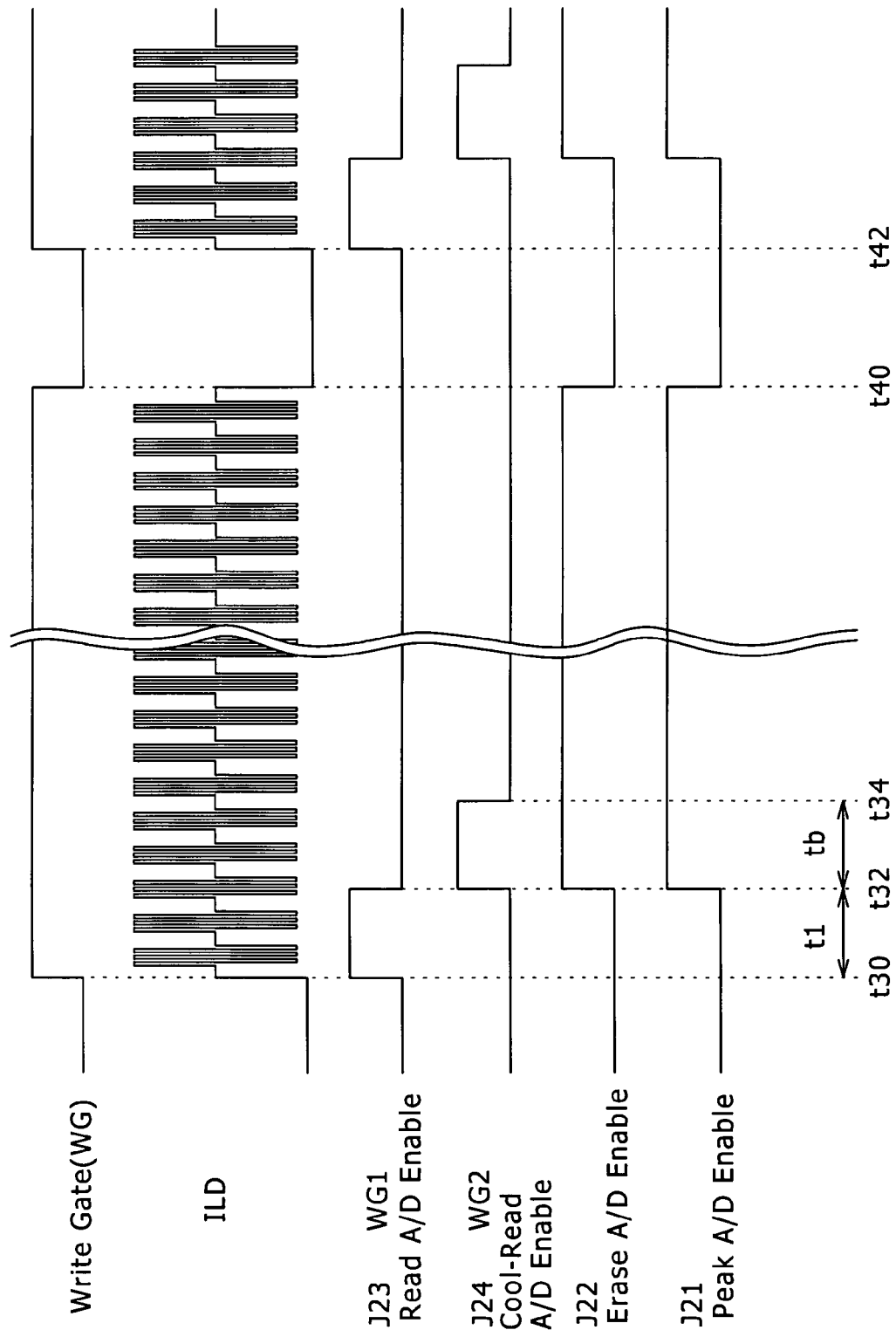
FIG. 8 is a timing chart of assistance in explaining operation of the level detection and detected output comparison units according to the second embodiment shown in FIG. 7.

FIG. 8 is a timing chart of assistance in explaining operation of the level detection and detected output comparison units 41 according to the second embodiment shown in FIG. 7. First, in timing of switching from the reproduction mode to the recording mode (t30), a control signal WG1 is activated. Thereafter, until the control signal WG1 becomes inactive (t32), an integrator 108RD holds a read current indicating voltage Vr, and the sequential comparison type AD converting circuit including the comparator 152BM, the first counter 154BM, and the DA converting part 124BM subjects the output Vr to AD conversion.

When the control signal WG1 becomes inactive (t32), the first counter 154 converts a digital value after AD conversion to a two's complement, and sets the two's complement as a "−Read" value in the second counter 156.

Next, from timing of activation of a control signal WG2 (t32) to timing of inactivation of the control signal WG2 (t34), the integrator 108BM holds a cool current indicating voltage Vc, and the sequential comparison type AD converting circuit including the comparator 152BM, the first counter 154BM, and the DA converting part 124BM subjects the output Vc to AD conversion.

At this time, the second counter 156 simultaneously counts up from the initial value "−Read," and latches a count value of the second counter 156 at a point of coincidence of comparator inputs. Consequently, the second counter 156 retains the count value as a difference "Vc@t34−Vr@t32."

An interval from t30 to t32, that is, a period when the control signal WG1 is active is used for a pull-in time of each power for recording. Even an interval from t30 to t34 is a sufficiently short time free from the effect of a temperature drift of the laser.

After passage of the recording interval (t40), the switch 158BM selects the count output of the second counter 156BM which output is input to the terminal on the negative logic XWG side of the switch 158BM, and inputs the selected output to the DA converting part 124BM. Thus, the initial current value adjusting part 120BM performs an analog subtraction process between the output Vc of the integrator 108BM on the cool side in the recording interval and a difference "Vc@t34−Vr@t32" obtained by subjecting the difference data Vc@t34−Vr™t32 retained in the second counter 156 to DA conversion by the DA converting part 124. In timing of switching from the recording mode to the reproduction mode (t40), a difference Vc@t40−(Vc@t34−Vr@t32) is used as a voltage indicating an initial value of the read current Ir.

That is, also in the second embodiment, at the time of the mode transition from recording to reproduction, from a driving current immediately before the mode transition, that is, the cool current Ic of two kinds of currents including the laser driving threshold current in the recording mode and the reproduction mode, specifically the read current Ir and the cool current Ic providing the bias current at the time of recording, another laser driving current after the mode transition, that is, the read current Ir (voltage corresponding to the read current Ir) is calculated. The voltage is used as a voltage for setting the initial value of the read current Ir.

Integrator outputs as voltages indicating the erase current Ie and the peak current Ip, respectively, are subjected to AD conversion by a sequential comparison type AD converting circuit including the comparator 152AV, the first counter 154AV, and the DA converting part 124AV or including a comparator 152PK, the first counter 154PK, and a DA converting part 124PK during the recording interval after t32.

During a reproduction interval from t40 to t42, an adding part 142 performs an analog addition process between the output of the integrator 108RD for read power control, that is, the error output Vr of an error amplifying part 102RD and a value (Vc@t34−Vr@t32) obtained by subjecting the difference data "Vc@t34−Vr@t32" retained in the second counter 156BM to DA conversion by the DA converting part 124BM. In timing of switching from the reproduction mode to the recording mode (t42), an obtained addition result Vc@t42 +(Vc@t34−Vr@t32) is used as a voltage indicating an initial value of the cool current Ic.

That is, also in the second embodiment, at the time of the mode transition from reproduction to recording, from a driving current immediately before the mode transition, that is, the read current Ir of two kinds of currents including the laser driving threshold current in the recording mode and the reproduction mode, specifically the read current Ir and the cool current Ic providing the bias current at the time of recording, another laser driving current after the mode transition, that is, the cool current Ic (voltage corresponding to the cool current Ic) is calculated. The voltage is used as a voltage for setting the initial value of the cool current Ic.

On the other hand, as for the erase current Ie and the peak current Ip, data subjected to AD conversion by the AD converting parts 122AV and 122PK at the end of the previous recording interval is retained in the registers 159AV and 159PK, and the data is subjected to DA conversion by the DA converting parts 124AV and 124PK to be used for setting respective initial values of the erase current Ie and the peak current Ip.

A temperature variation component of the light emission threshold value Ith in light emission characteristics of the laser dependent on the temperature is completely removed from the initial values of these laser powers. It is therefore possible to emit light accurately with desired laser powers from a start of a mode.

<Details of Level Detection and Detected Output Comparison Units; Third Embodiment>

Figure 9:
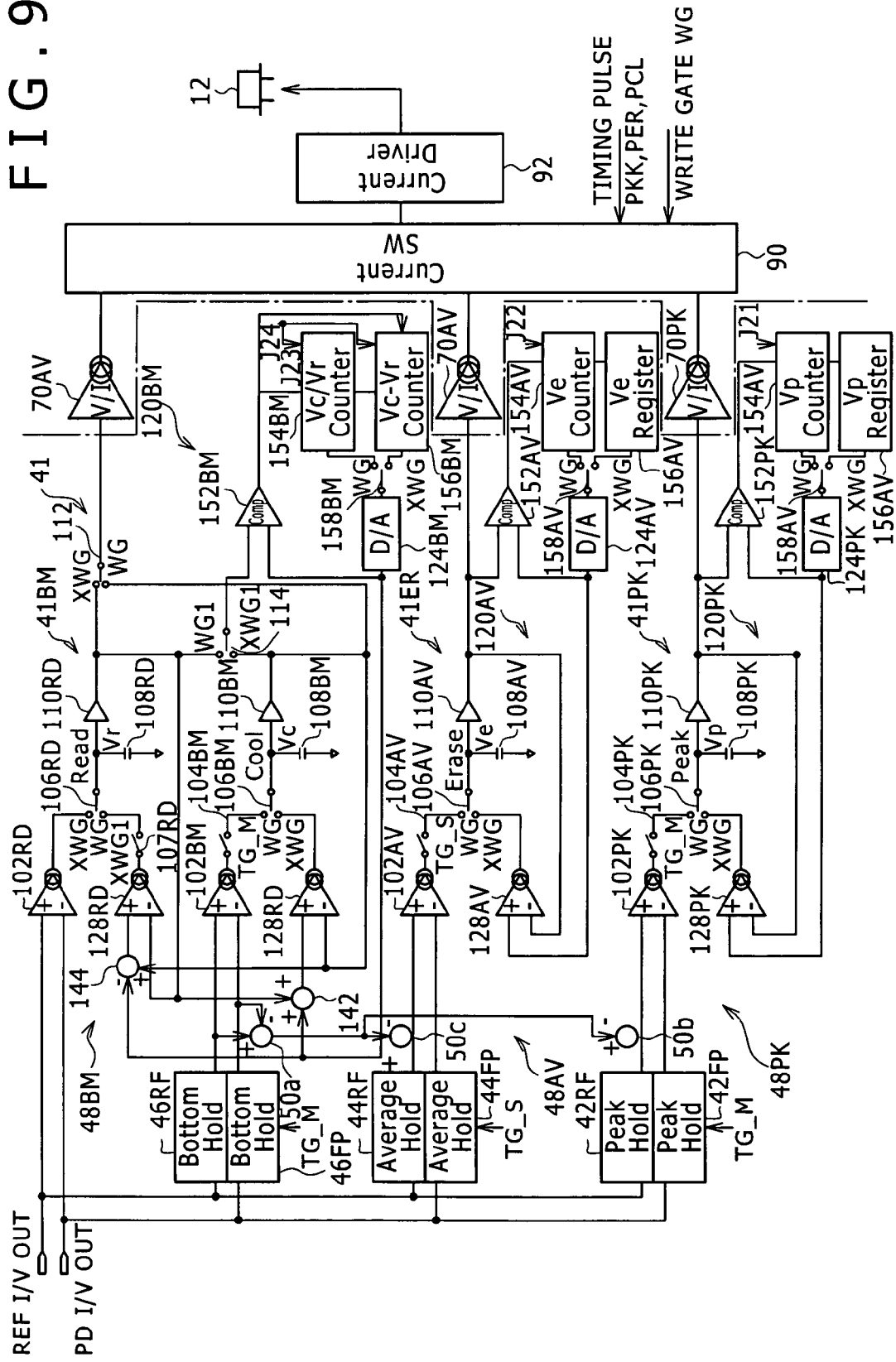
FIG. 9 is a block diagram of assistance in explaining a third embodiment of detailed configuration of the level detection and detected output comparison units.

FIG. 9 is a block diagram of assistance in explaining a third embodiment of detailed configuration of the level detection and detected output comparison units 41PK, 41AV, and 41BM. The third embodiment is characterized by having an error correcting part 50 for correcting an error amplifier input in a control loop for providing a current pulse by using an input error of an error amplifier in a control loop for providing a bias current, in superimposing the current pulse for generating a light emission waveform of multilevel power on the bias current component providing the threshold current of the laser, thereby generating a combined current, and supplying the combined current to the laser to thereby perform pulse driving of the laser.

"Correcting an error amplifier input in a control loop for providing a current pulse" means correction of one of input components, that is, a feedback component and a reference component input to the error amplifier forming the control loop for providing the current pulse. For example, the input error of the error amplifier in the control loop for providing the bias current is preferably subtracted from one of the input components or added to one of the input components.

The configuration of the third embodiment is characterized by having the error correcting part 50 for subtracting the input error of the error amplifier in the control loop for providing the bias current from an error amplifier input in another power control loop. Concrete description will be made in the following.

A level detection and detected output comparison unit 41 according to the third embodiment has an input error extracting part 50a for extracting the input error ΔV50 of the error amplifier in the control loop for providing the bias current by subtracting a bottom detection voltage FPBM detected by a level detecting part 46FP for the bottom level in the detection system using the photodiode 16 from a bottom reference voltage VREBM as a reference input for the bottom level which voltage is detected by a level detecting part 46RE in the reference system using the reference current generating unit 32.

In addition, the error correcting part 50 has an input error subtracting part 50b between a level detecting part 42RE and a reference side input of an error amplifying part 102PK, the input error subtracting part 50b subtracting the input error ΔV50 extracted by the input error extracting part 50a from a peak reference voltage VREPK detected by the level detecting part 42RE for the peak level, as a configuration for eliminating the effect of the input error of an error amplifying part 102BM in the control loop for controlling the cool current Ic providing the bias current from the control loop for providing the peak current Ip as one component of current pulses.

The error correcting part 50 has an input error subtracting part 50c between a level detecting part 44RE and a reference side input of an error amplifying part 102AV, the input error subtracting part 50c subtracting the input error ΔV50 extracted by the input error extracting part 50a from an average reference voltage VREAV detected by the level detecting part 44RE for the average level, as a configuration for eliminating the effect of the input error of the error amplifying part 102BM in the control loop for controlling the cool current Ic providing the bias current from the control loop for providing the erase current Ie as the other component of the current pulses.

The input error subtracting part 50b and the input error subtracting part 50c are each an example of a correcting part for correcting one input component of the error amplifying parts 102PK and 102AV on the basis of the input error ΔV50 extracted by the input error extracting part.

Figure 10:
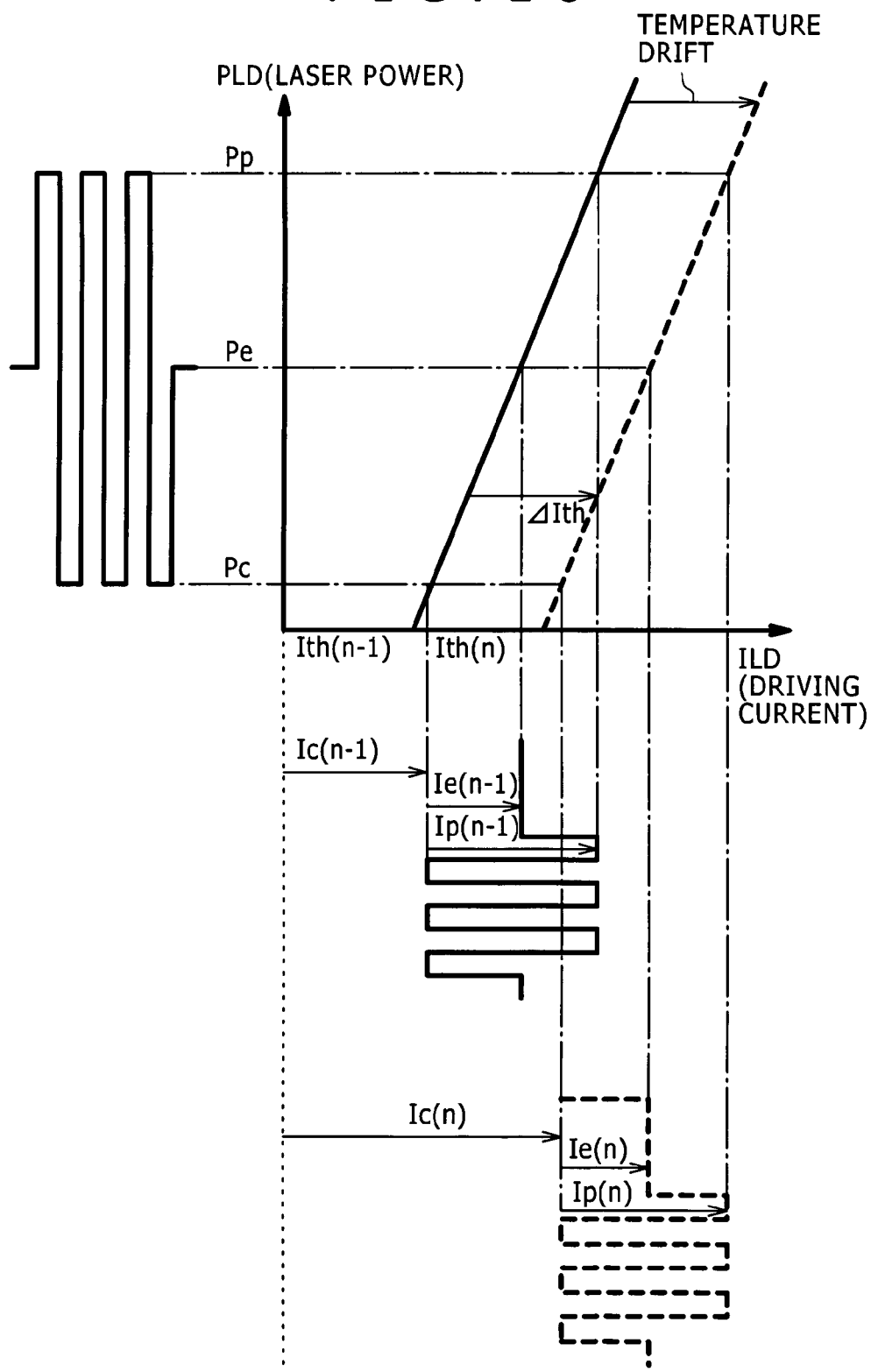
FIG. 10 is a diagram (1) of assistance in explaining the effect of a cool current error in a pull-in process at the time of a start.
Figure 11:
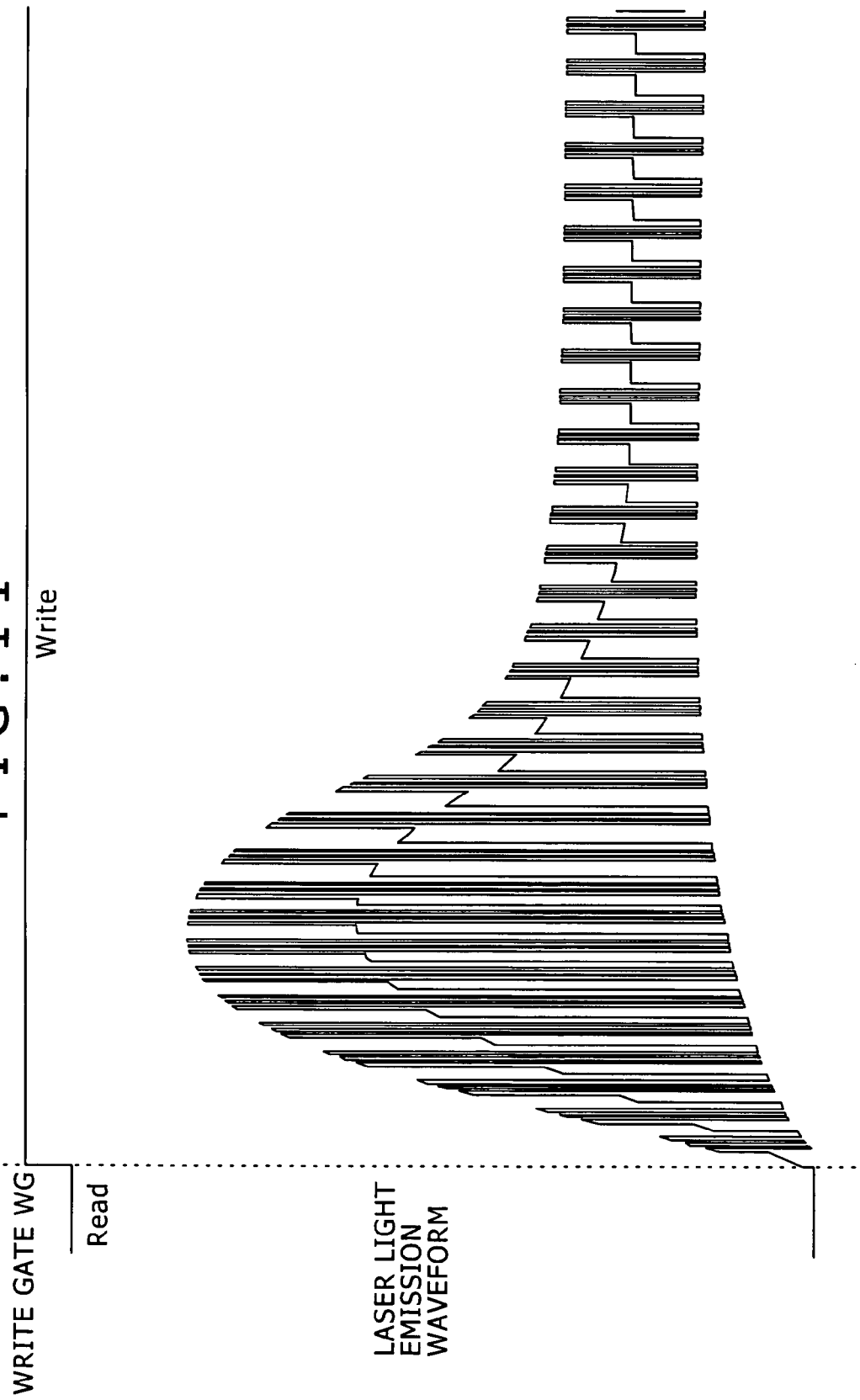
FIG. 11 is a diagram (2) of assistance in explaining the effect of a cool current error in a pull-in process at the time of a start.
Figure 12:
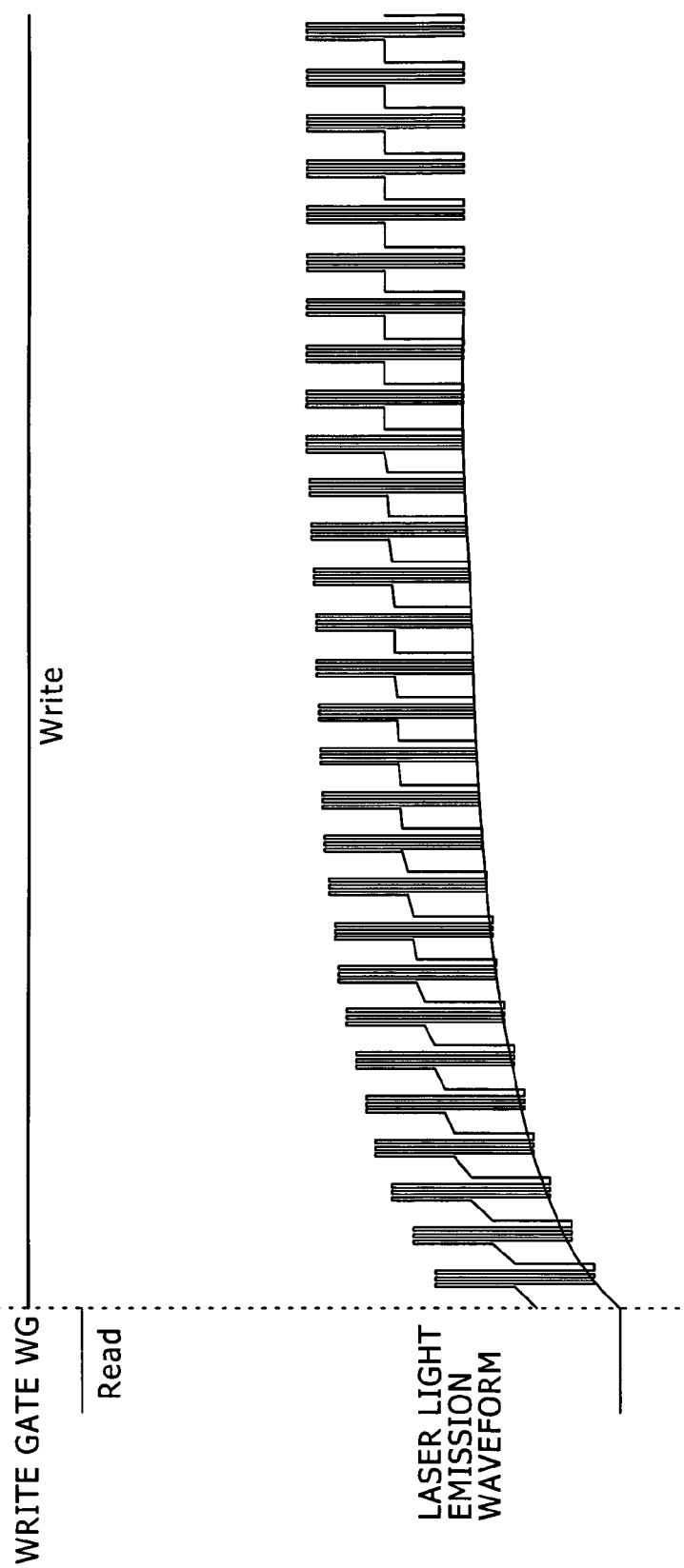
FIG. 12 is a diagram showing an effect produced by providing an error correcting part.

FIG. 10 and FIG. 11 are diagrams of assistance in explaining effects of the third embodiment. FIG. 12 is a diagram showing an effect produced by providing the error correcting part 50.

When a method of obtaining a desired laser driving current waveform as shown in FIG. 4 by superimposing the erase current Ie and the peak current Ip on the cool current Ic is used, the method being considered to be the simplest and rational as a method for generating the laser light emission waveform as shown in FIGS. 3A and 3B on the phase change disk by the current switch, supposing that the error correcting part 50 is not provided and that therefore the level detecting part 42RE and the input of the error amplifying part 102PK are directly connected to each other and the level detecting part 44RE and the input of the error amplifying part 102AV are directly connected to each other, an error of the cool current Ic in a first pull-in process affects the peak and erase control loops. This is because while once pull-in is performed, a pull-in characteristic at the time of a mode change can be improved by applying the first embodiment or the second embodiment, currents in a mode before a mode change cannot be obtained at the time of a start.

Consideration will be given to a case where only the threshold current in the characteristics of the semiconductor laser 12 is changed by ΔIth due to an increase in the temperature as in FIG. 10, for example. After the increase in the temperature, desired laser powers can be obtained by pulling in the variation component of ΔIth by the cool current Ic with the peak current Ip and the erase current Ie remaining the same.

Even when a control current for each laser power pulled in by APC before the increase in the temperature is given as current for setting an initial value, the light emission power of the semiconductor laser 12 is shifted to a lower side by an amount corresponding to ΔIth in DC terms. In this state, when the error correcting part 50 is not provided in the APC system shown in FIG. 1 and APC is performed for each power without time division, an error of ΔIth is input as an initial error to the peak current Ip and the erase current Ie, thus acting to increase the peak current Ip and the erase current Ie.

Thus, the peak current Ip and the erase current Ie has a pull-in characteristic in which the peak current Ip and the erase current Ie become higher than a target level and are then lowered, as shown in FIG. 11.

Insufficient optimization of each APC loop characteristic may lead to a serious accident to a storage medium in that marks recorded on the disk are erased as the case may be.

On the other hand, the third embodiment has the error correcting part 50 so that pull-in response of APC for controlling a plurality of laser powers of a waveform being recorded on the phase change disk or the like is stabilized and consequently a pull-in time can be shortened. This point will be described in the following.

As described above, the error correcting part 50 is configured to subtract a difference as the input error ΔV50 obtained by subtracting a voltage input to the error amplifying part 102BM in the photodiode detection system as the APC loop feedback system, that is, the bottom detection voltage FPBM detected by the level detecting part 46FP from a voltage on the reference input side of the error amplifying part 102BM as error amplifier in the cool current control loop, that is, the bottom reference voltage VREBM detected by the level detecting part 46RE from the reference input of the error amplifying part 102PK as error amplifier in the peak current control loop and the reference input of the error amplifying part 102AV as error amplifier in the erase current control loop.

Thus, the respective inputs to the error amplifiers (error amplifying parts 102AV and 102PK) in the respective control loops for the erase current Ie and the peak current Ip providing current pulses are corrected by using the input error ΔV50 of the error amplifier (error amplifying part 102BM) in the control loop for the cool current Ic providing the bias current.

With such a configuration, it is possible to eliminate the effect of the error occurring in a cool level pull-in process and added to the peak level detection system and the erase level detection system.

As described with reference to FIG. 10, when a control current for each laser power before the increase in the temperature is given as current for setting an initial value, the light emission power of the semiconductor laser 12 is lower by an amount corresponding to ΔIth in DC terms due to the increase in the temperature. Since an initial error corresponding to the shift is subtracted in advance from the peak reference level and the erase reference level, only cool APC responds without the peak current Ip and the erase current Ie being changed. Consequently, stable light emission waveform pull-in response is obtained, as shown in FIG. 12.

As described above, according to the third embodiment, in performing laser power control of the APC system for controlling multilevel power as of a laser light emission waveform at the time of recording on a writable optical disk, an input error of an error amplifier in a control loop for providing a bias current is subtracted from error amplifier inputs in other power control loops. It is therefore possible to easily eliminate the effect of an error in the control loop for the cool current Ic providing the bias current from the power control loops for the erase current Ie and the peak current Ip providing current pulses.

Thereby, at the time of a start, a stable pull-in characteristic is obtained, a power pull-in time is consequently shortened, and further a band of an APC loop characteristic can be raised to reduce the pull-in time.

In addition, since insensitivity to changes in APC loop characteristics such for example as variations in the optical system is acquired, a margin for these variations is greatly improved.

More stable laser power control is made possible, contributing to achievement of higher transfer rate and higher density.

It is to be noted that the configuration for "correcting an error amplifier input in a control loop for providing a current pulse" is not limited to that of the third embodiment. For example, the input error of the error amplifier in the control loop for providing the bias current may be extracted by subtracting the input of the photodiode detection system from the reference input, and the extracted input error may be added to the error amplifier input of the photodiode detection system in another control loop.

Alternatively, the input error of the error amplifier in the control loop for providing the bias current may be extracted by subtracting the reference input from the input of the photodiode detection system, and the extracted input error may be added to a reference input of error amplifier inputs in another control loop.

Alternatively, the input error of the error amplifier in the control loop for providing the bias current may be extracted by subtracting the reference input from the input of the photodiode detection system, and the extracted input error may be subtracted from the error amplifier input of the photodiode detection system in another control loop.

It should be understood by those skilled in the art that various modifications, combinations, sub-combinations and alterations may occur depending on design requirements and other factors insofar as they are within the scope of the appended claims or the equivalents thereof.

What is claimed is:

1. A laser driving method for driving a laser, said laser driving method comprising the step of:
    adjusting an initial value of a driving current for driving said laser when an operation mode is changed on a basis of a difference in magnitude between a first bias current comprising information on threshold current of said laser in a first operation mode and a second bias current comprising information on said threshold current in a second operation mode, and
    performing pulse driving of said laser by generating a combined current by superimposing a current pulse for generating a light emission waveform of multilevel power on bias current comprising information on the threshold current of said laser, and supplying the combined current to said laser,
    wherein said first operation mode is a reproduction mode, and said first bias current is the driving current in said reproduction mode, and said second operation mode is a recording mode, and said second bias current is a current on which said current pulse is superimposed in the driving current in said recording mode.

2. The laser driving method as claimed in claim 1, wherein output power of laser light emitted from said laser is detected, and control is performed so as to make the detected output power constant.

3. The laser driving method as claimed in claim 1, wherein at a time of an operation mode transition, the driving current after the transition is calculated on a basis of the driving current for driving said laser before the transition, and the calculated current is used as said initial value of the driving current.

4. The laser driving method as claimed in claim 1, wherein excluding said bias currents in said reproduction mode and said recording mode, respectively, as the initial value of the driving current for driving said laser in a present operation mode, the driving current in a previous identical mode is used.

5. The laser driving method as claimed in claim 4, wherein as the initial value of the driving current of said current pulse for driving said laser in said recording mode, the driving current of said current pulse in a previous identical mode is used.

6. The laser driving method as claimed in claim 1, wherein output power of laser light emitted from said laser is detected, and control is performed so as to make the detected output power constant; and an error amplifier input in a control loop for providing said current pulse is corrected by using an input error of an error amplifier in a control loop for providing said bias current.

7. A laser driving device for driving a laser, said laser driving device comprising: an initial current value adjusting unit for adjusting an initial value of driving current for driving said laser when an operation mode is changed on a basis of a difference in magnitude between a first bias current comprising information on threshold current of said laser in a first operation mode and a second bias current comprising information on said threshold current in a second operation mode,
    wherein said laser driving device performs pulse driving of said laser by generating a combined current by superimposing a current pulse for generating a light emission waveform of multilevel power on a bias current component providing the threshold current of said laser, and supplying the combined current to said laser; said first operation mode is a reproduction mode, and said first bias current is the driving current in said reproduction mode; and said second operation mode is a recording mode, and said second bias current is the current on which said current pulse is superimposed in the driving current in said recording mode.

8. The laser driving device as claimed in claim 7, further comprising: a laser power detecting unit for detecting output power of laser light emitted from said laser; and a control loop for controlling said bias currents so as to make said output power detected by said laser power detecting unit constant.

9. The laser driving device as claimed in claim 7, wherein at a time of an operation mode transition, said initial current value adjusting unit calculates the driving current after the transition on a basis of the driving current for driving said laser before the transition, and uses the calculated current as said initial value of the driving current.

10. The laser driving device as claimed in claim 7, wherein excluding said bias currents in said reproduction mode and said recording mode, respectively, as the initial value of the driving current for driving said laser in a present operation mode, said initial current value adjusting unit uses the driving current in a previous identical mode.

11. The laser driving device as claimed in claim 10, wherein as the initial value of the driving current of said current pulse for driving said laser in said recording mode, said initial current value adjusting unit uses the driving current of said current pulse in a previous identical mode.

12. The laser driving device as claimed in claim 7, wherein at a time of a mode transition, said initial current value adjusting unit obtains said initial value of the driving current on a basis of said driving current within a predetermined period in which a temperature drift of said laser before and after the transition is substantially negligible.

13. The laser driving device as claimed in claim 7, wherein said initial current value adjusting unit comprises a storage unit for retaining information on the difference between said bias currents.

14. The laser driving device as claimed in claim 13, wherein said storage unit retains the information on the difference between said bias currents as digital data.

15. The laser driving device as claimed in claim 7, further comprising:
   a laser power detecting unit for detecting output power of laser light emitted from said laser;
   a control loop for controlling said bias current so as to make the output power detected by said laser power detecting unit constant; and
   a correcting unit for correcting an error amplifier input in a control loop for providing said current pulse by using an input error of an error amplifier in a control loop for providing said bias current.

16. The laser driving device as claimed in claim 15, wherein said control loop comprises
   a first error amplifying unit supplied with a feedback component corresponding to said bias current in said output power detected by said laser power detecting unit and a reference component providing a reference for said bias current,
   a bias control loop for controlling said bias current so as to make an input error of said first error amplifying unit zero,
   a second error amplifying unit supplied with a feedback component corresponding to said current pulse in said output power detected by said laser power detecting unit and a reference component providing a reference for said current pulse,
   a current pulse control loop for controlling said current pulse so as to make an input error of said second error amplifying unit zero, and
   an input error extracting unit for extracting the input error between said feedback component and said reference component in said first error amplifying unit; and
   said correcting unit corrects one input component of said second error amplifying unit on a basis of the input error extracted by said input error extracting unit.

17. A laser driving method for performing pulse driving by generating a combined current by superimposing a current pulse for generating a light emission waveform of multilevel power on a bias current comprising information on threshold current of a laser, and supplying the combined current to said laser, said laser driving method comprising the step of:
   adjusting an initial value of driving current for driving said laser when an operation mode is changed on a basis of a difference in magnitude between a first bias current that comprises information on the threshold current of said laser in a reproduction mode and is the driving current in said reproduction mode and a second bias current that comprises information on said threshold current in a recording mode and is the current on which said current pulse is superimposed in the driving current in said recording mode.

18. A laser driving device for performing pulse driving of a laser by generating a combined current by superimposing a current pulse for generating a light emission waveform of multilevel power on a bias current component providing threshold current of said laser, and supplying the combined current to said laser, said laser driving device comprising:
   an initial current value adjusting unit for adjusting an initial value of driving current for driving said laser when an operation mode is changed on a basis of a difference in magnitude between a first bias current that comprises information on the threshold current of said laser in a reproduction mode and is the driving current in said reproduction mode and a second bias current that comprises information on said threshold current in a recording mode and is the current on which said current pulse is superimposed in the driving current in said recording mode.

* * * * *